US011980044B2

(12) United States Patent
Yamada et al.

(10) Patent No.: US 11,980,044 B2
(45) Date of Patent: May 7, 2024

(54) ORGANIC LIGHT EMITTING DEVICE, AND DISPLAY APPARATUS, PHOTOELECTRIC CONVERSION APPARATUS, ELECTRONIC APPARATUS, ILLUMINATION APPARATUS, AND MOVING OBJECT INCLUDING THE SAME

(71) Applicant: CANON KABUSHIKI KAISHA, Tokyo (JP)

(72) Inventors: Naoki Yamada, Inagi (JP); Satoru Shiobara, Hiratsuka (JP); Itaru Takaya, Atsugi (JP); Jun Kamatani, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 64 days.

(21) Appl. No.: 16/861,076

(22) Filed: Apr. 28, 2020

(65) Prior Publication Data

US 2020/0358020 A1 Nov. 12, 2020

(30) Foreign Application Priority Data

May 7, 2019 (JP) ................................ 2019-087710

(51) Int. Cl.
*H10K 50/11* (2023.01)
*H10K 50/15* (2023.01)
(Continued)

(52) U.S. Cl.
CPC ............. *H10K 50/11* (2023.02); *H10K 50/15* (2023.02); *H10K 50/16* (2023.02); *H10K 50/17* (2023.02); *H10K 50/818* (2023.02); *H10K 59/124* (2023.02); *H10K 59/60* (2023.02); *H10K 85/623* (2023.02); *H10K 85/631* (2023.02); *H10K 2101/30* (2023.02); *H10K 2101/40* (2023.02)

(58) Field of Classification Search
CPC ............. H01L 51/5004; H01L 51/5064; H01L 2251/552; H01L 51/506; H10K 50/156; H10K 2101/40
See application file for complete search history.

(56) References Cited

U.S. PATENT DOCUMENTS

2012/0223297 A1 9/2012 Yamamoto
2012/0235131 A1* 9/2012 Okamoto ............... H05B 33/10 257/E51.026
(Continued)

FOREIGN PATENT DOCUMENTS

CN 103872253 A 6/2014
EP 2365555 A2 9/2011
(Continued)

*Primary Examiner* — Alia Sabur
(74) *Attorney, Agent, or Firm* — CANON U.S.A., INC., IP Division

(57) ABSTRACT

An organic light emitting device including, in sequence, a first electrode, a first charge transport layer, a second charge transport layer in contact with the first charge transport layer, a light emitting layer in contact with the second charge transport layer, and a second electrode, wherein the first charge transport layer includes a first material and a second material, the second charge transport layer includes the second material and a third material, and the light emitting layer includes the third material and a fourth material.

27 Claims, 6 Drawing Sheets

(51) Int. Cl.

| | |
|---|---|
| ***H10K 50/16*** | (2023.01) |
| ***H10K 50/17*** | (2023.01) |
| ***H10K 50/818*** | (2023.01) |
| ***H10K 59/124*** | (2023.01) |
| ***H10K 59/60*** | (2023.01) |
| ***H10K 85/60*** | (2023.01) |
| ***H10K 101/30*** | (2023.01) |
| ***H10K 101/40*** | (2023.01) |

(56) References Cited

U.S. PATENT DOCUMENTS

2013/0049581 A1* 2/2013 Nishide .................. C09K 11/06 585/27
2013/0299788 A1 11/2013 Sakuma et al.
2013/0313535 A1 11/2013 Heo et al.
2014/0110687 A1* 4/2014 Yamada ............. H01L 51/0058 585/27
2014/0183475 A1 7/2014 Song et al.
2015/0236267 A1 8/2015 Hiroaki
2016/0155950 A1* 6/2016 Kim .................... H01L 51/0052 257/40
2017/0084855 A1* 3/2017 Kam ................... H01L 51/5265
2018/0033995 A1 2/2018 Kim
2018/0287084 A1* 10/2018 Park .................... H01L 51/5056

FOREIGN PATENT DOCUMENTS

JP 2002-313583 A 10/2002
JP 200231583 A * 10/2002 ........... H01L 51/002
JP 2004-111080 A 4/2004
JP 2005-353526 A 12/2005
JP 2007096322 A 4/2007
JP 2012515438 A 7/2012
JP 2012-186258 A 9/2012
JP 2013-049640 A 3/2013
JP 2015-005552 A 1/2015
JP 2020184568 A 11/2020
WO 2012/060329 A1 5/2012

* cited by examiner

ORGANIC LIGHT EMITTING DEVICE, AND DISPLAY APPARATUS, PHOTOELECTRIC CONVERSION APPARATUS, ELECTRONIC APPARATUS, ILLUMINATION APPARATUS, AND MOVING OBJECT INCLUDING THE SAME

BACKGROUND OF THE INVENTION

Field of the Invention

The present disclosure relates to an organic light emitting device, and a display apparatus, a photoelectric conversion apparatus, an electronic apparatus, an illumination apparatus, and a moving object that include the organic light emitting device.

Description of the Related Art

The organic light emitting device is a device including a first electrode, a second electrode, and a light emitting layer disposed between these electrodes. Injection of carriers from these electrodes causes generation of excitons in the light emitting layer. The excitons return to the ground state while releasing energy as light emission. In recent years, research and development has been underway for apparatuses including organic light emitting devices, such as display apparatuses, electronic apparatuses, and illumination apparatuses. In order to improve the performance of these apparatuses, intensive research and development is carried out for providing an organic light emitting device driven at a lower voltage and having a longer longevity.

Japanese Patent Laid-Open No. 2012-186258 (hereinafter PTL 1) discloses an organic light emitting device having a hole injection layer and a hole transport layer. According to PTL 1, the hole injection layer and the hole transport layer have an electron transport material, to thereby suppress remaining of, in the hole injection layer and the hole transport layer, electrons having moved from the light emitting layer, to increase the longevity of the device.

The organic light emitting device disclosed in PTL 1 has, in order to rapidly move electrons having moved from the light emitting layer to the anode, an electron transport material in the hole injection layer and the hole transport layer. However, the configuration has room for further improvement in order to reduce the drive voltage of the organic light emitting device.

SUMMARY OF THE INVENTION

The present disclosure provides an organic light emitting device having a reduced drive voltage.

An embodiment of the present disclosure provides an organic light emitting device including, in sequence, a first electrode, a first charge transport layer, a second charge transport layer in contact with the first charge transport layer, a light emitting layer in contact with the second charge transport layer, and a second electrode, wherein the first charge transport layer includes a first material and a second material, the second charge transport layer includes the second material and a third material, and the light emitting layer includes the third material and a fourth material.

Further features of the present disclosure will become apparent from the following description of exemplary embodiments with reference to the attached drawings.

DESCRIPTION OF THE EMBODIMENTS

An organic light emitting device according to an embodiment of the present disclosure is an organic light emitting device including, in sequence, a first electrode, a first charge transport layer, a second charge transport layer in contact with the first charge transport layer, a light emitting layer in contact with the second charge transport layer, and a second electrode, wherein the first charge transport layer includes a first material and a second material, the second charge transport layer includes the second material and a third material, and the light emitting layer includes the third material and a fourth material.

The organic light emitting device according to this embodiment includes the first charge transport layer, the second charge transport layer, and the light emitting layer. Among these layers, adjacent layers have the same material in common, to thereby achieve a reduction in the resistance at the interface between the layers.

Figure 1:
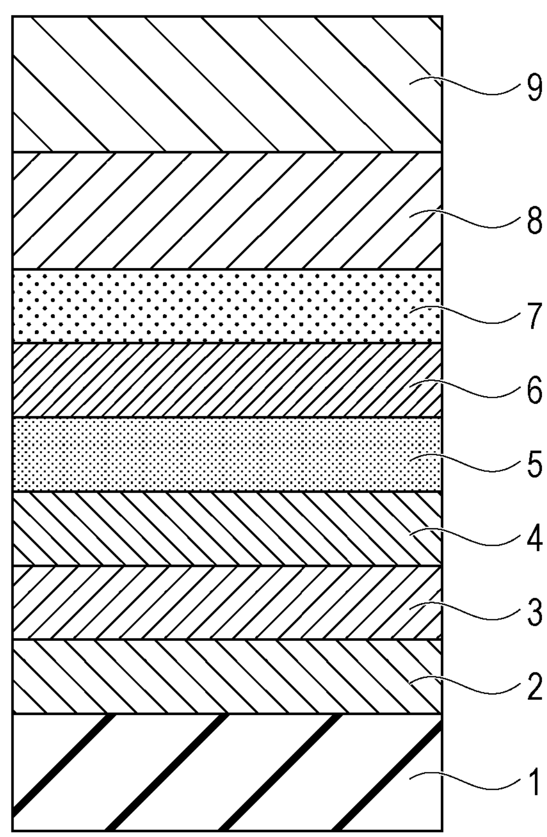
FIG. 1 is a schematic sectional view illustrating an example of an organic light emitting device according to an embodiment of the present disclosure.

Hereinafter, an embodiment of the present disclosure will be described further in detail with reference to FIG. 1. FIG. 1 is a schematic sectional view of an embodiment of the present disclosure. Referring to FIG. 1, the organic light emitting device includes a stack of, on an insulating layer 1, in sequence, an anode 2, a hole injection layer 3, a first hole transport layer 4, a second hole transport layer 5, a light emitting layer 6, an electron transport layer 7, an electron injection layer 8, and a cathode 9. The first hole transport layer 4, the second hole transport layer 5, and the light emitting layer 6 are stacked as adjacent layers. The light emitting layer 6 may be constituted by a plurality of layers, and may include another functional layer between the plurality of light emitting layers. FIG. 1 merely illustrates a representative configuration. This configuration may further optionally include, for example, a hole injection layer, a hole transport layer, an electron transport layer, and an electron injection layer, or may not include such organic compound layers.

In this embodiment, the first hole transport layer serves as the first charge transport layer, and the second hole transport layer serves as the second charge transport layer. Thus, the first material and the second material have a hole transport capability.

The first hole transport layer includes the first material and the second material. The second hole transport layer includes the second material, which is also included in the first hole transport layer, and a third material. The light emitting layer includes the third material, which is also included in the second hole transport layer, and a fourth material. The fourth material may be a light emitting material.

Figure 2:
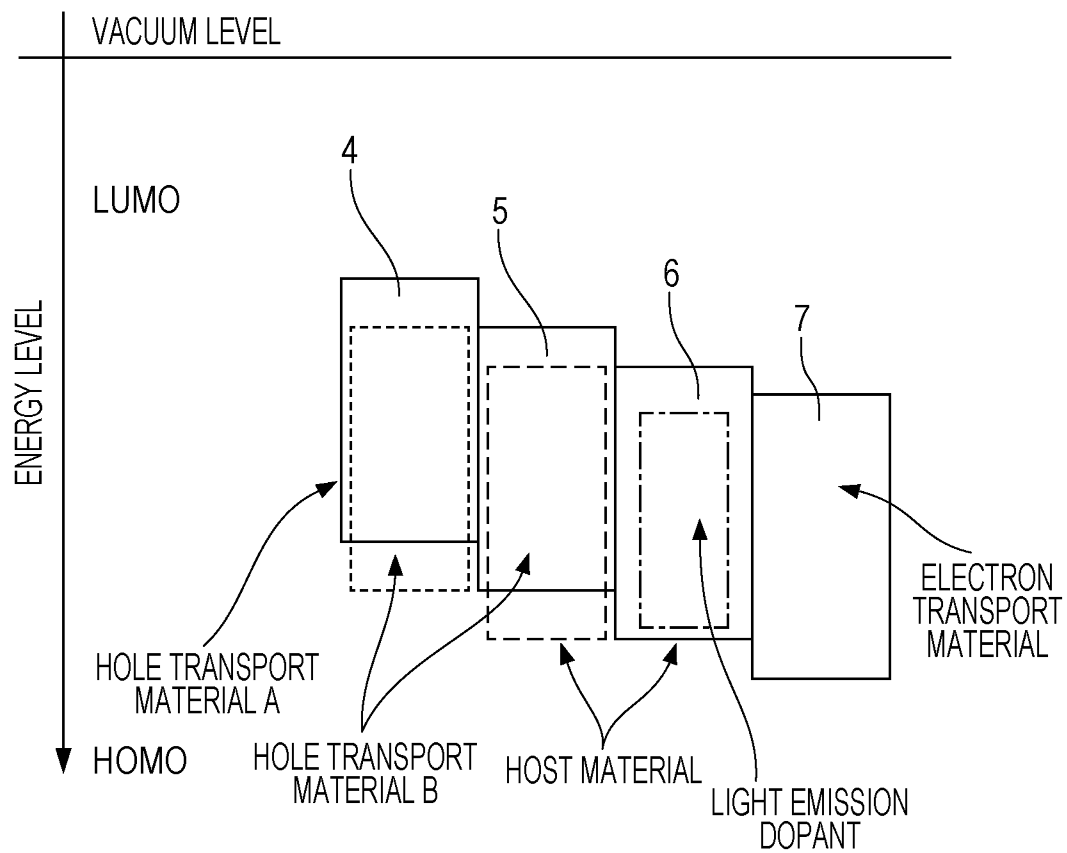
FIG. 2 is a schematic energy diagram of the energy levels of a light emitting layer and adjacent layers constituting an organic light emitting device according to an embodiment of the present disclosure.

FIG. 2 is a schematic energy diagram illustrating an example of the energy levels of the first hole transport layer, the second hole transport layer, the light emitting layer, and the electron transport layer constituting an organic light emitting device according to an embodiment of the present disclosure. FIG. 2 does not illustrate the first electrode and the second electrode.

Incidentally, HOMO energy and LUMO energy are determined relative to the vacuum level. Ordinary molecules have negative values for HOMO energy and LUMO energy. In this Specification, HOMO energy and LUMO energy are described using absolute values, specifically using positive values. HOMO stands for Highest Occupied Molecular Orbital. LUMO stands for Lowest Unoccupied Molecular Orbital.

In this embodiment, the first electrode serves as the anode, and the second electrode serves as the cathode. The first charge transport layer serves as the first hole transport layer, and the second charge transport layer serves as the second hole transport layer. Thus, the first hole transport layer includes, as the first material, a hole transport material A, and, as the second material, a hole transport material B. The second hole transport layer includes, as the second material, the hole transport material B, and, as the third material, a host material. The light emitting layer includes, as the third material, the host material, and, as the fourth material, a light emission dopant.

The organic light emitting device according to this embodiment has the following feature, to thereby provide an organic light emitting device having a reduced drive voltage and good durability characteristics:

(1) the first hole transport layer and the second hole transport layer have the same material in common, and the second hole transport layer and the light emitting layer have the same material in common.

Referring to FIG. 2, in the organic light emitting device according to this embodiment, the first hole transport layer includes the hole transport material A and the hole transport material B, and the second hole transport layer includes the hole transport material B and the host material. In this way, the organic compound layer closer to the anode is formed so as to include mixed materials including a material of its adjacent layer, to thereby exert an effect of reducing the injection barrier.

Mixing of the materials inferentially causes interaction between the materials to generate an energy level at an intermediate level between the levels of these materials, which results in a reduction in the injection barrier.

In this embodiment, the first hole transport layer and the second hole transport layer are each a mixture layer including a plurality of materials. When two hole transport layers are formed such that one of them is a mixture layer, the injection barrier is not sufficiently reduced and the drive voltage increases. By contrast, when two hole transport layers are formed such that both of them are mixture layers, the injection barrier can be considerably reduced.

In the organic light emitting device according to this embodiment, the first hole transport layer may have various mixing ratios of the hole transport material A to the hole transport material B. When the hole transport material A content is higher, a reduction in the voltage tends to be achieved. When the hole transport material B content is higher, an increased efficiency is achieved.

In the organic light emitting device according to this embodiment, the second hole transport layer may have various mixing ratios of the hole transport material B to the host material. When the host material content is higher, a reduction in the voltage tends to be achieved. When the hole transport material B content is higher, an increased efficiency is achieved.

The device can have a configuration that satisfies, in addition to the feature (1), the following conditions:

(2) the light emitting layer is an electron-trap light emitting layer;

(3) absolute value of HOMO energy: (Host material)>(Hole transport material B)>(Hole transport material A);

(4) absolute value of LUMO energy: (Host material)>(Hole transport material B)>(Hole transport material A);

(5) the dopant material is constituted by a condensed ring including a five-membered ring; and (6) the host material is constituted by a material composed of a hydrocarbon alone.

Hereinafter, these features will be described.

(2) The light emitting layer is an electron-trap light emitting layer

The organic light emitting device according to this embodiment may include an electron-trap light emitting layer. A light emitting layer is an electron-trap light emitting layer when it satisfies the following relation:

(Absolute value of LUMO energy: host material)<(Absolute value of LUMO energy: dopant material); or preferably (Absolute value of LUMO energy: host material)<(Absolute value of LUMO energy: dopant material) and (Absolute value of HOMO energy: host material)<(Absolute value of HOMO energy: dopant material).

In the organic light emitting device according to an embodiment of the present disclosure, the second hole transport layer and the light emitting layer include the same material in common, to thereby improve the hole injection capability. However, as a result of this feature, electrons injected from the cathode and having reached the light emitting layer may reach the second hole transport layer. When electrons from the cathode reach the second hole transport layer, light emission efficiency may decrease. Accordingly, an electron-trap light emitting layer is disposed to thereby provide a configuration in which electrons injected from the cathode to the light emitting layer are trapped by the light emission dopant. This suppresses reaching of electrons to the second hole transport layer, to thereby provide an organic light emitting device having a reduced voltage, high efficiency, and high durability.

(3) (Absolute value of HOMO energy: third material)>(Absolute value of HOMO energy: second material)>(Absolute value of HOMO energy: first material)

In other words, the absolute value of HOMO energy decreases in the following order: the host material, the hole transport material B, and the hole transport material A.

When this relation is satisfied, the stacked layers have absolute values of HOMO energy that sequentially increase from the anode-side layer to the host material having a larger absolute value of HOMO energy. This configuration provides a high hole injection capability.

(4) (Absolute value of LUMO energy: third material)>(Absolute value of LUMO energy: second material)>(Absolute value of LUMO energy: first material)

In other words, the absolute value of LUMO energy decreases in the following order: the host material, the hole transport material B, and the hole transport material A. When this relation is satisfied, the first hole transport layer and the second hole transport layer can be disposed in an order such that the absolute value of LUMO energy decreases from the light emitting layer-side layer. Thus, this configuration includes, on its anode side, two hole transport layers also serving as electron blocking function layers, to thereby suppress flow of electrons to the anode side. More specifically, the hole transport material B exerts an effect of suppressing flow of electrons from the light emitting layer to the second hole transport layer; and the hole transport material A exerts an effect of reducing flow of electrons from the second hole transport layer to the first hole transport layer.

(5) Dopant material is constituted by condensed ring including five-membered ring In the present disclosure, a compound used as the dopant is not particularly limited, but, from the viewpoint of the above-described electron-trap capability, can include a condensed ring including a five-membered ring having an electron-withdrawing structure such as a fluoranthene skeleton. This achieves an increase in the LUMO energy. This provides an increase in the difference from the LUMO energy of the host material, to thereby achieve improvement in the electron-trap capability. The compound used as the dopant desirably does not have an electron-donating substituted amino group. This is because when the compound has such a substituted amino group, the LUMO energy decreases, which results in a lower electron-trap capability.

From the viewpoint of bonding stability, the compound used as the dopant can be a compound not including a substituted amino group including the single bond of the nitrogen-carbon bond.

In summary, when the dopant is a compound that includes a condensed ring including a five-membered ring and not including a substituted amino group, a light emitting layer having a high electron-trap capability can be formed.

Here, the condensed ring including a five-membered ring will be described. The condensed ring including a five-membered ring is a condensed polycyclic compound that encompasses fluoranthene and compounds provided by condensation of fluoranthene and an aromatic hydrocarbon. Specific examples include condensed polycyclic compounds represented by the following FF1 to FF30.

FF1

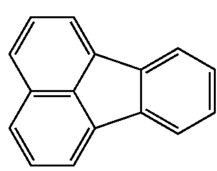

-continued

FF2

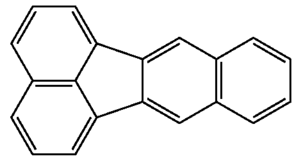

FF3

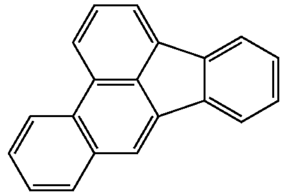

FF4

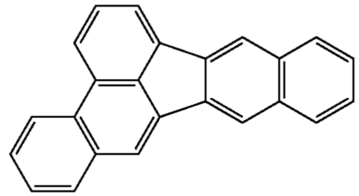

FF5

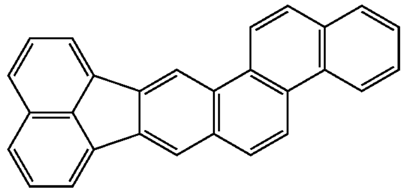

FF6

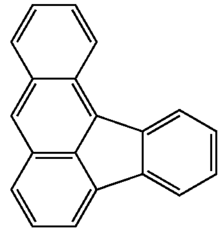

FF7

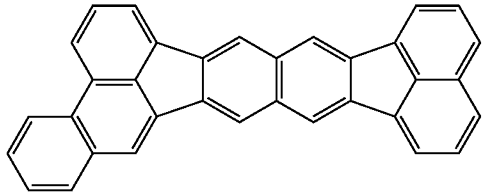

FF8

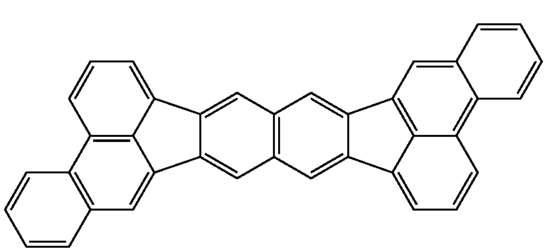

-continued
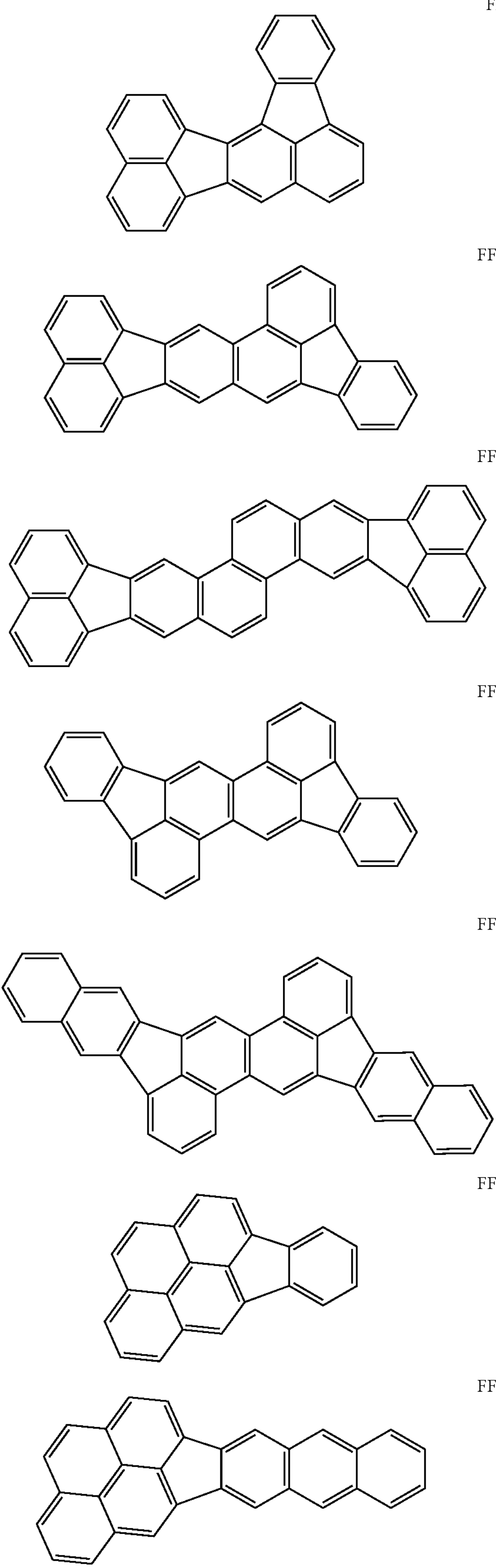
-continued
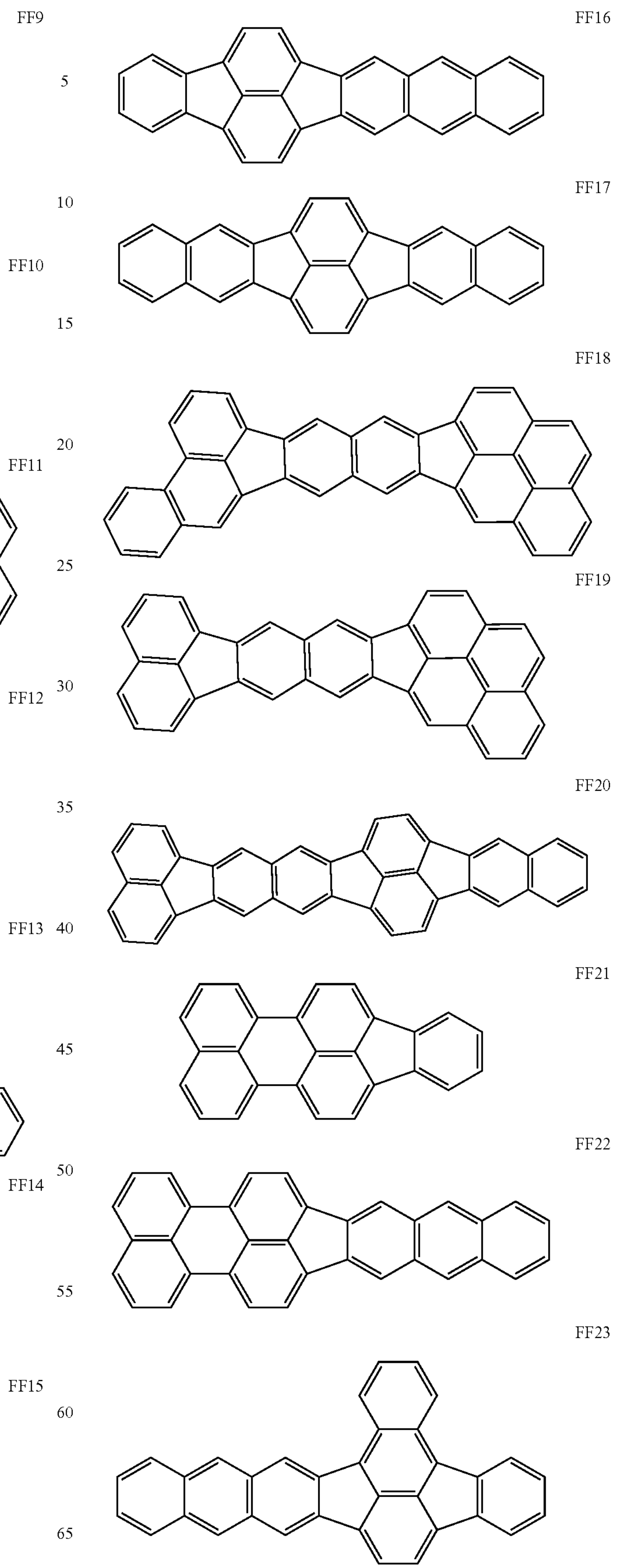

-continued

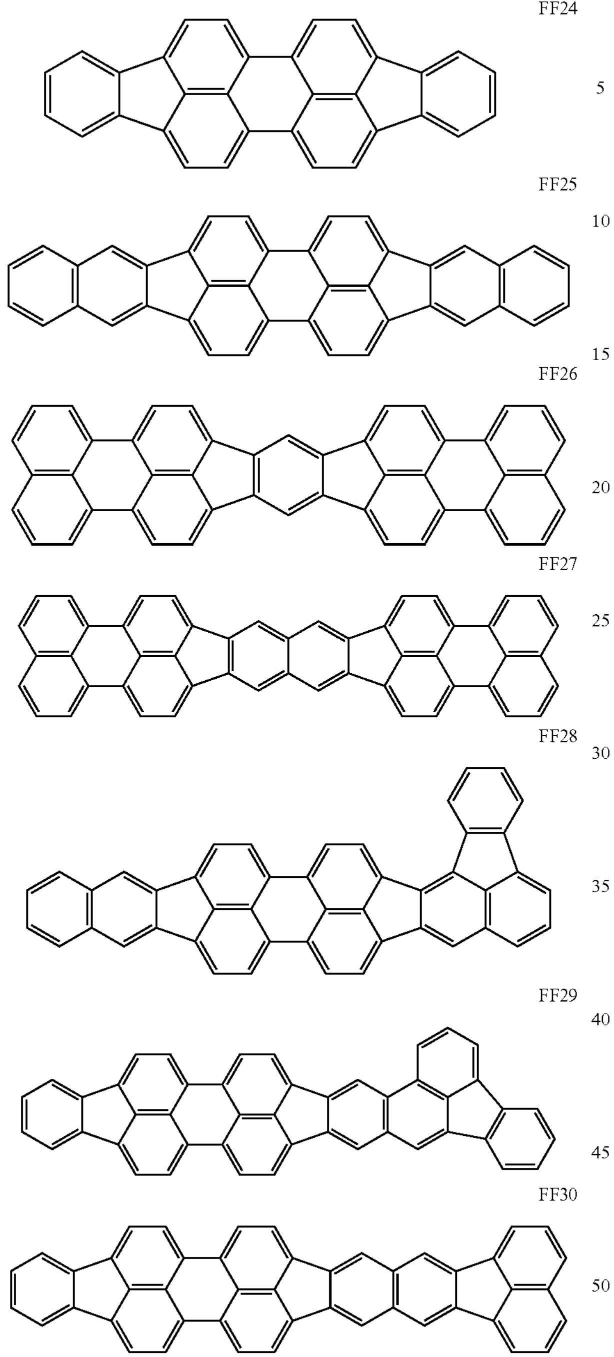

Of these, from the viewpoint of improving the electron-withdrawing capability and improving the electron-trap capability, preferred are dopants including two or more five-membered rings such as a dopant having a structure in which two or more fluoranthenes are condensed. Specifically, the dopants having skeletons of FF7 to FF13, FF16 to FF20, and FF23 to FF30 can be used in the present disclosure.

(6) Host material is constituted by material composed of hydrocarbon alone

In the present disclosure, the compound used as the host material is not particularly limited, but can be a compound not including bonds having low bonding stability in the molecular structure. When a compound having, within the molecular structure, a bond having low bonding stability, in other words, a compound having an unstable bond having a low bond energy such as an amino group is included as the host of the light emitting layer constituting an organic light emitting device, the compound tends to undergo deterioration during driving of the device. The deterioration of the compound is not desirable because it has a high probability of adversely affecting the longevity of the organic light emitting device.

For example, in the following compounds A-1, A-2, and B-1, bonds having low bonding stability are the bond between a carbazole ring and a phenylene group and the bond (nitrogen-carbon bond) between an amino group and a phenyl group. Referring to compound B-1, the carbon-carbon bond has higher bonding stability. Incidentally, the calculation was performed using b3-lyp/def2-SV(P).

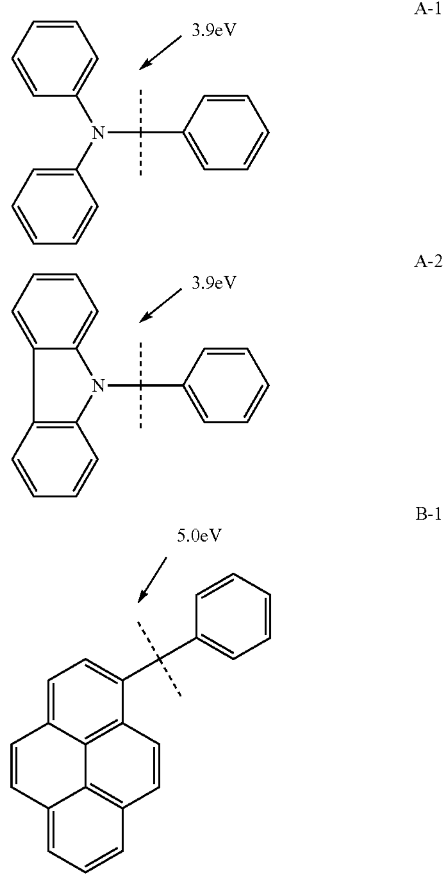

Incidentally, molecular orbital method calculation was performed using, the currently widely used program, Gaussian 09 (Gaussian 09, Revision C. 01, M. J. Frisch, G. W. Trucks, H. B. Schlegel, G. E. Scuseria, M. A. Robb, J. R. Cheeseman, G. Scalmani, V. Barone, B. Mennucci, G. A. Petersson, H. Nakatsuji, M. Caricato, X. Li, H. P. Hratchian, A. F. Izmaylov, J. Bloino, G. Zheng, J. L. Sonnenberg, M. Hada, M. Ehara, K. Toyota, R. Fukuda, J. Hasegawa, M. Ishida, T. Nakajima, Y. Honda, O. Kitao, H. Nakai, T. Vreven, J. A. Montgomery, Jr., J. E. Peralta, F. Ogliaro, M. Bearpark, J. J. Heyd, E. Brothers, K. N. Kudin, V. N. Staroverov, T. Keith, R. Kobayashi, J. Normand, K. Raghavachari, A. Rendell, J. C. Burant, S. S. Iyengar, J. Tomasi, M. Cossi, N. Rega, J. M. Millam, M. Klene, J. E. Knox, J. B. Cross, V. Bakken, C. Adamo, J. Jaramillo, R. Gomperts, R. E. Stratmann, O. Yazyev, A. J. Austin, R. Cammi, C. Pomelli, J. W. Ochterski, R. L. Martin, K. Morokuma, V. G. Zakrzewski, G. A. Voth, P. Salvador, J. J. Dannenberg, S. Dapprich, A. D. Daniels, O. Farkas, J. B. Foresman, J. V. Ortiz, J. Cioslowski, and D. J. Fox, Gaussian, Inc., Wallingford Conn., 2010.).

On the basis of the results, the host material of the organic light emitting device according to an embodiment of the present disclosure can be constituted by a material composed of a hydrocarbon alone.

The host material can have a molecular structure constituted by an aromatic hydrocarbon selected from benzene, naphthalene, fluorene, benzofluorene, phenanthrene, chrysene, triphenylene, pyrene, fluoranthene, and benzofluoranthene. In other words, the molecular structure can be constituted by an aromatic hydrocarbon in which the number of benzene rings linearly condensed is not more than two.

Incidentally, the host material may have, as a substituent, an alkyl group having 1 to 12 carbon atoms. Specific examples include a methyl group, an ethyl group, an n-propyl group, an iso-propyl group, an n-butyl group, an iso-butyl group, a sec-butyl group, a tert-butyl group, an n-pentyl group, an iso-pentyl group, a neo-pentyl group, a tert-pentyl group, a hexyl group, a heptyl group, and an octyl group.

Hereinafter, specific examples of electron transport materials used in an organic light emitting device according to an embodiment of the present disclosure will be described. The electron transport materials can be freely selected from materials that can transport electrons injected from the cathode to the light emitting layer. The electron transport materials are selected, for example, in balance with the hole mobility of the hole transport material. Examples of the material having electron transport performance include oxadiazole derivatives, oxazole derivatives, pyrazine derivatives, triazole derivatives, triazine derivatives, quinoline derivatives, quinoxaline derivatives, phenanthroline derivatives, organoaluminum complexes, and condensed ring compounds (such as fluorene derivatives, naphthalene derivatives, chrysene derivatives, and anthracene derivatives). These electron transport materials can also be used for the hole blocking layer.

The following are non-limiting specific examples of compounds used as the electron transport materials.

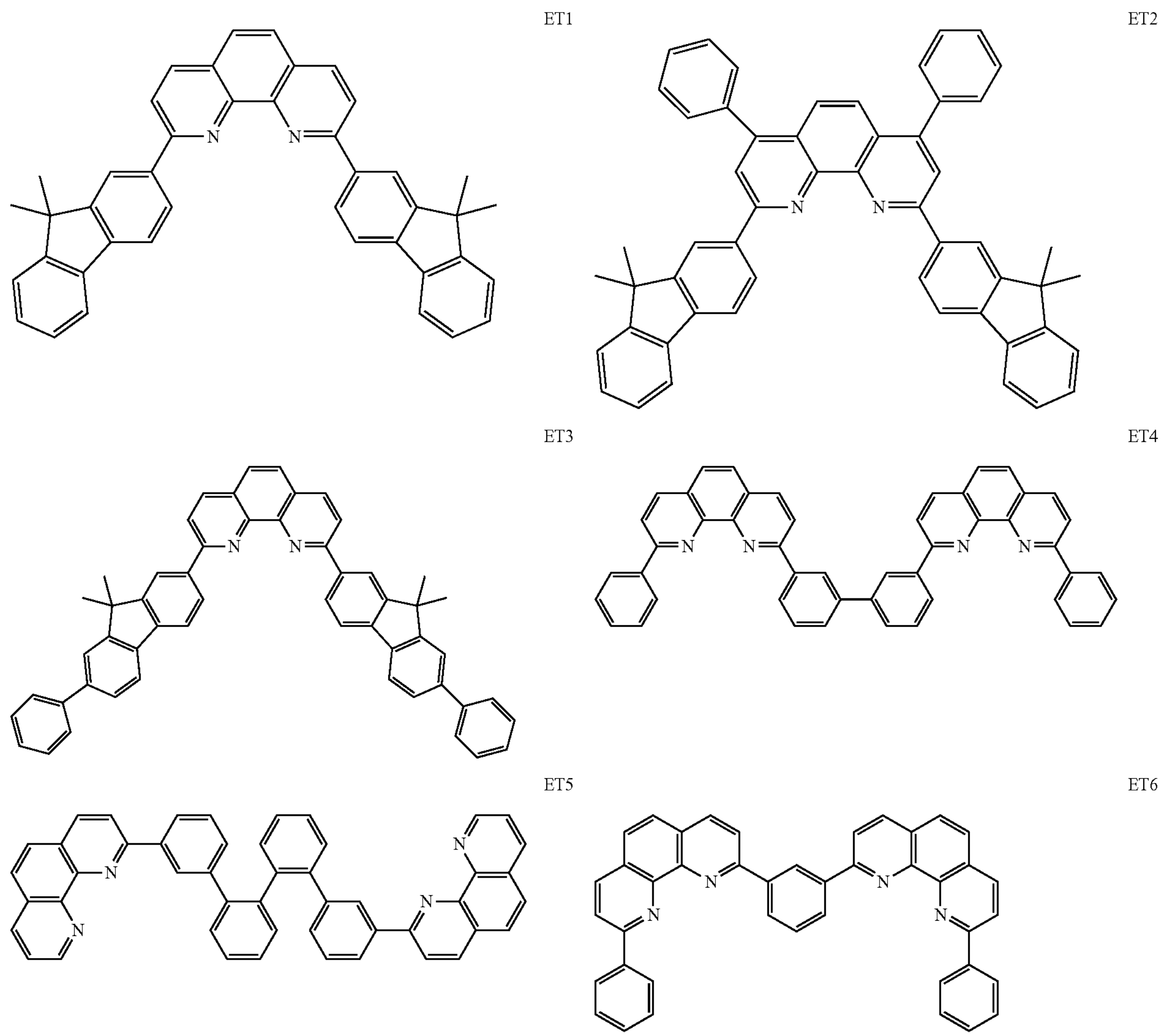

-continued
ET7
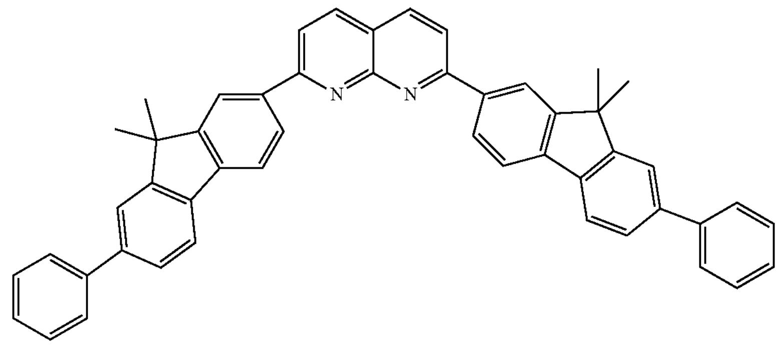
ET8
ET9
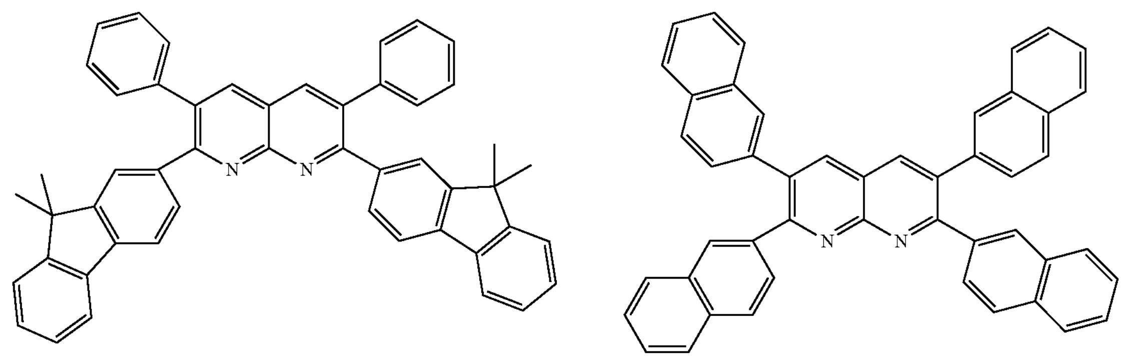
ET10
ET11
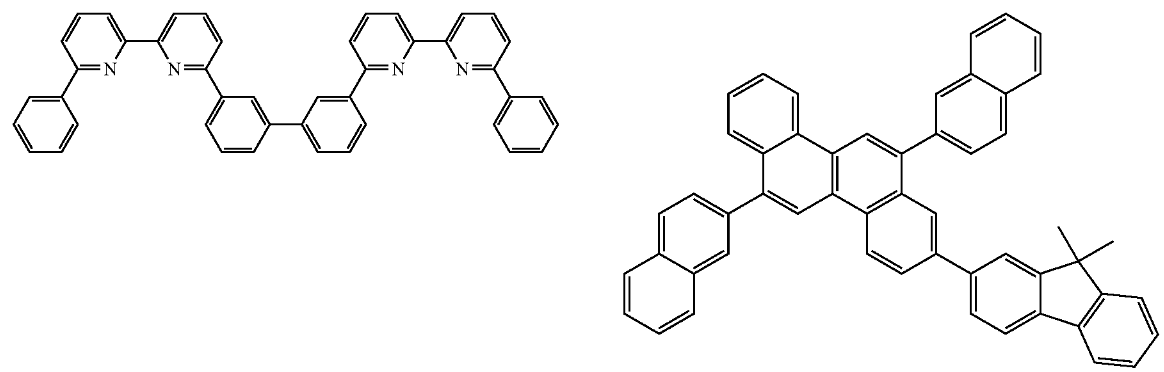
ET12
ET13
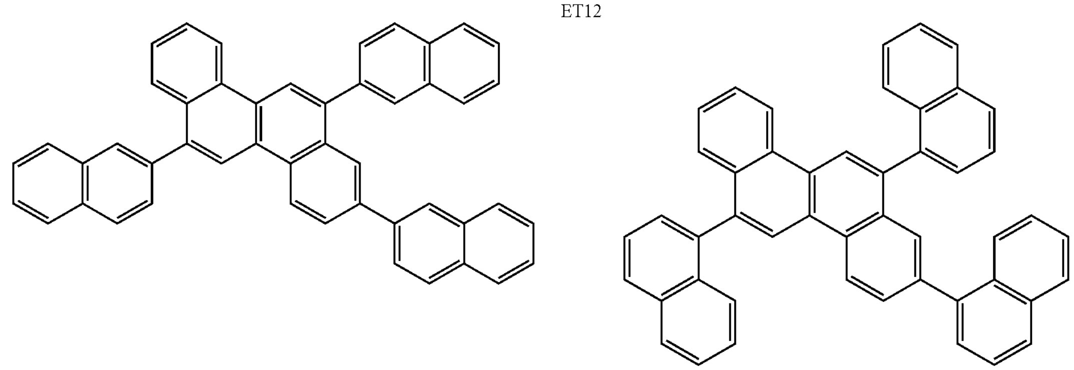

-continued
ET14
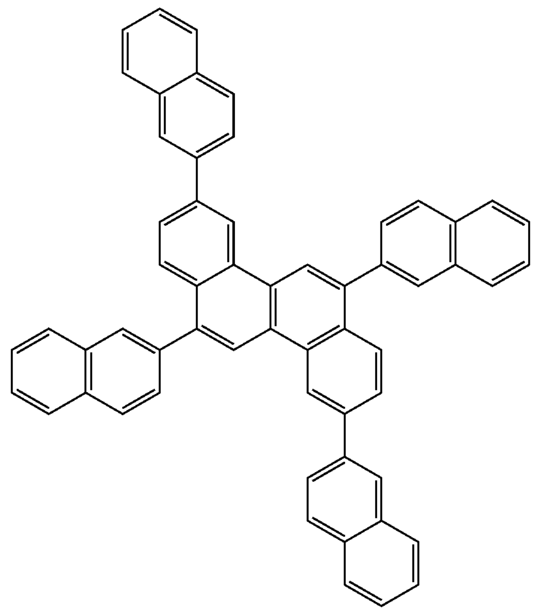
ET15
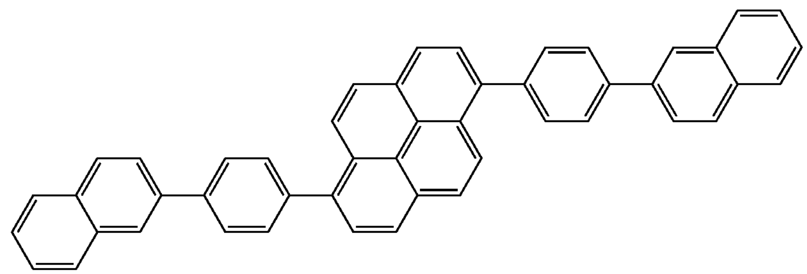
ET16
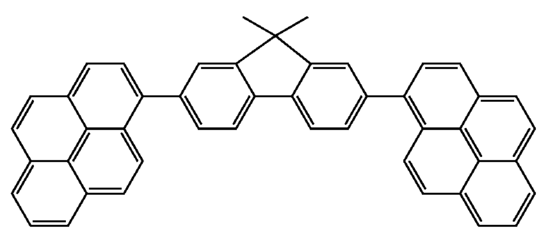
ET17
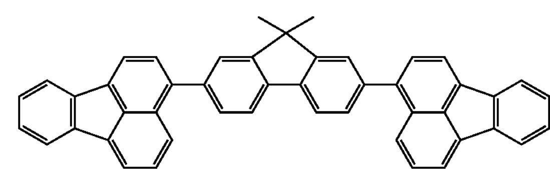
ET18
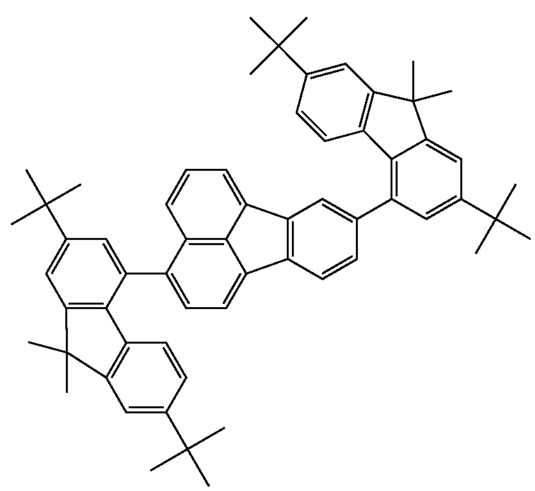
ET19
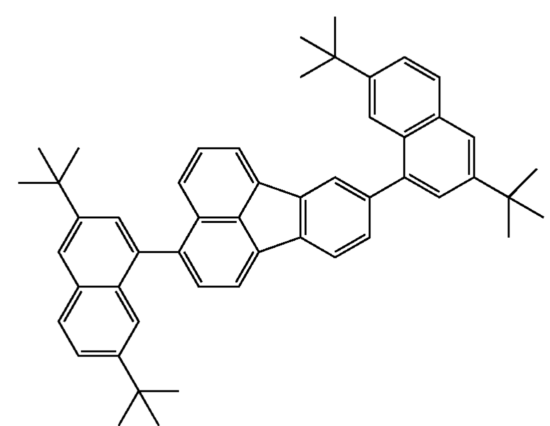

-continued

ET20

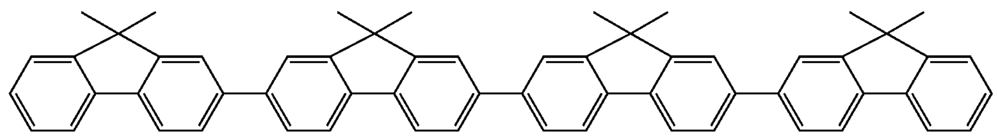

ET21

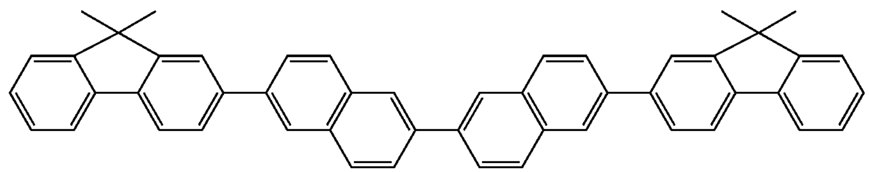

ET22

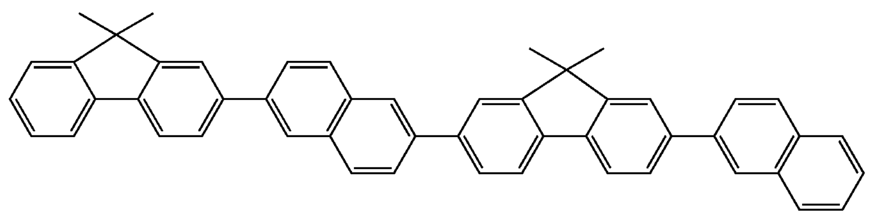

ET23

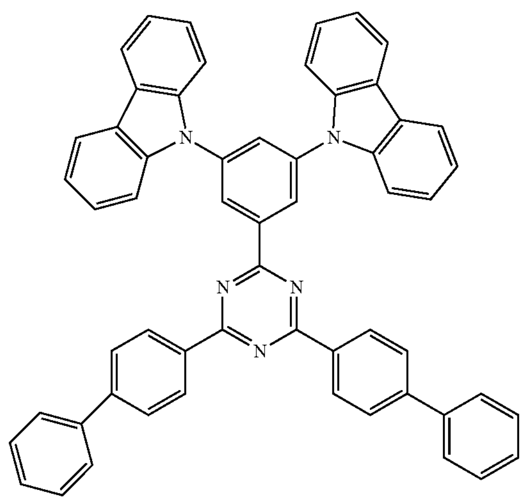

ET24

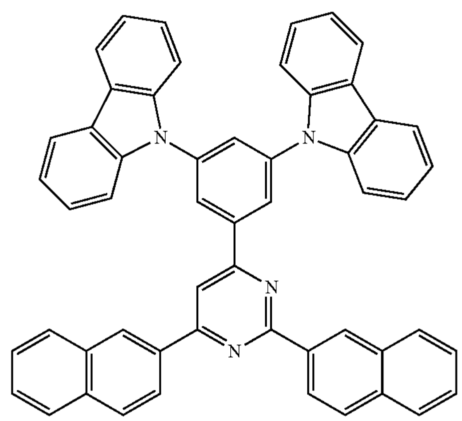

Hereinafter, specific examples of the hole transport material used for an organic light emitting device according to an embodiment of the present disclosure will be described. The hole injection transport material can be a material that facilitates injection of holes from the anode, and that has a high hole mobility in order to transport the injected holes to the light emitting layer. Examples of low-molecular-weight or high-molecular-weight materials having such hole injection transport performance include triaryl amine derivatives, aryl carbazole derivatives, phenylenediamine derivatives, stilbene derivatives, phthalocyanine derivatives, porphyrin derivatives, poly(vinylcarbazole), poly(thiophene), and other conductive polymers. Such a hole injection transport material can also be used for the electron blocking layer.

The following are non-limiting specific examples of compounds used as the hole injection transport material.
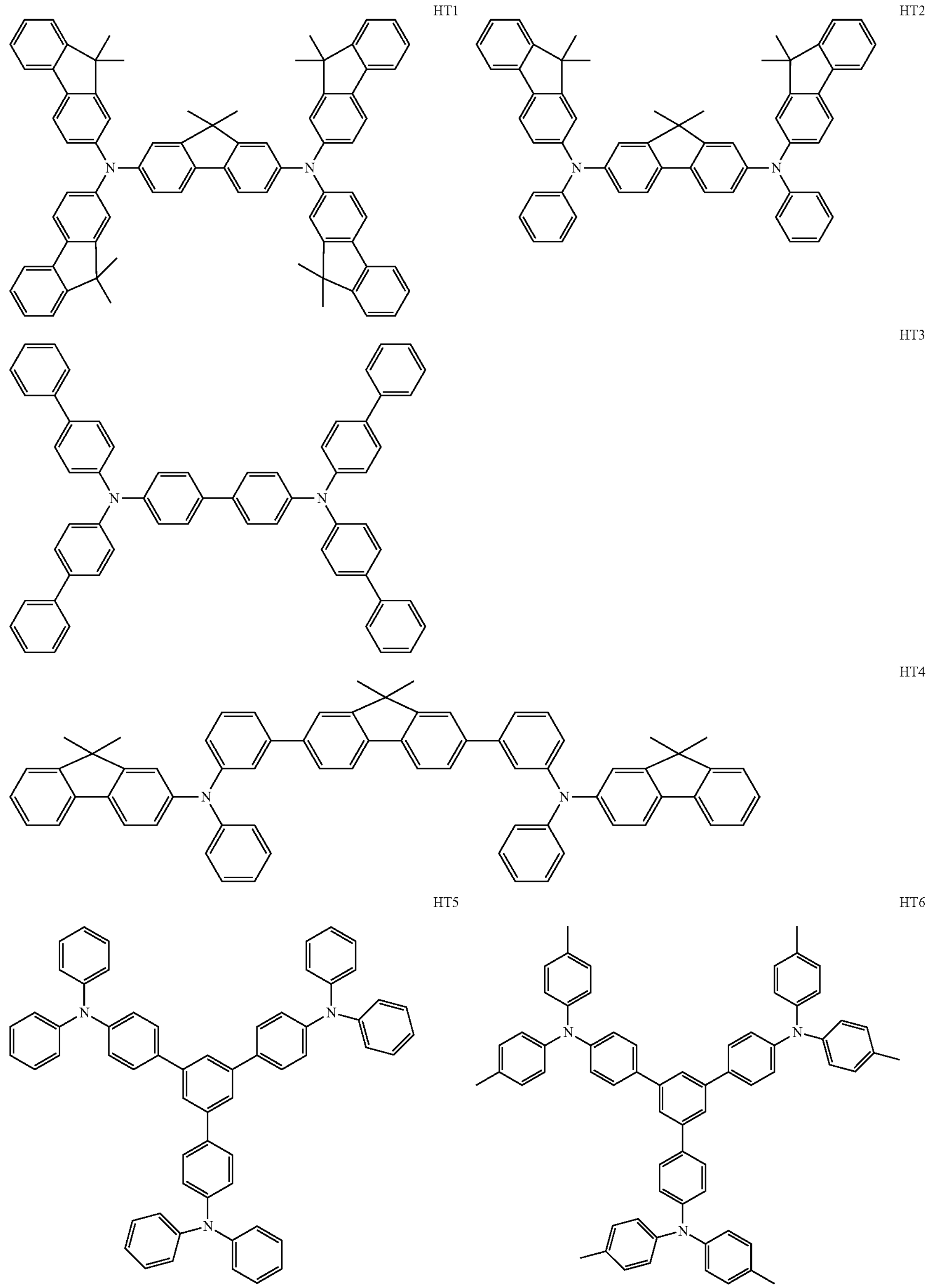

-continued
HT7
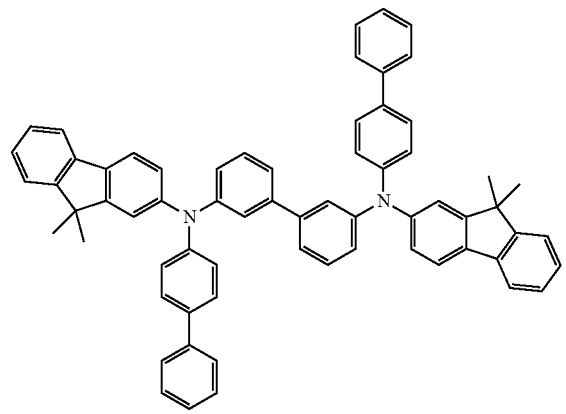
HT8
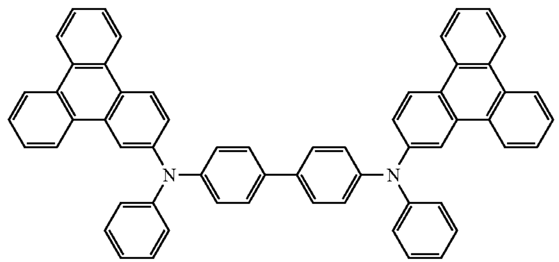
HT9
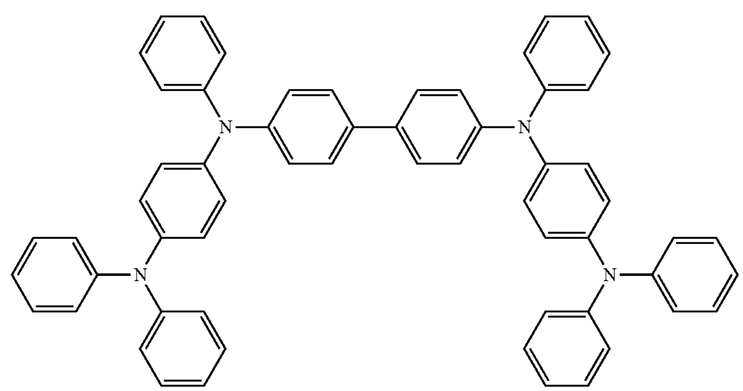
HT10
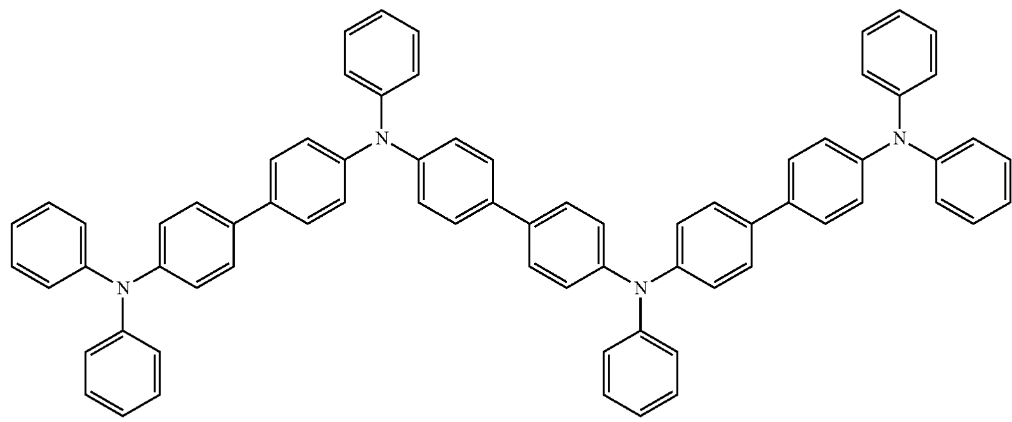
HT11
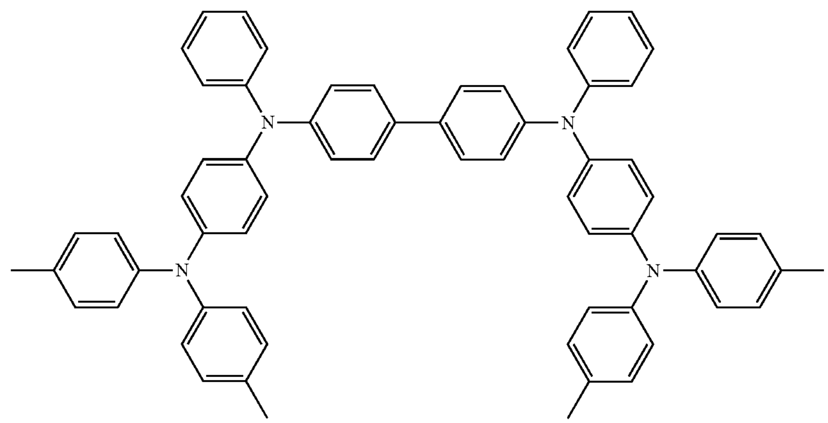

-continued
HT12
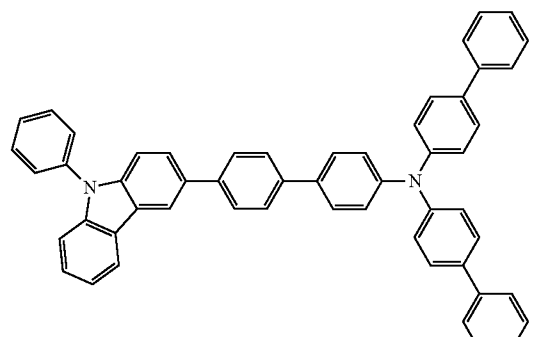
HT13
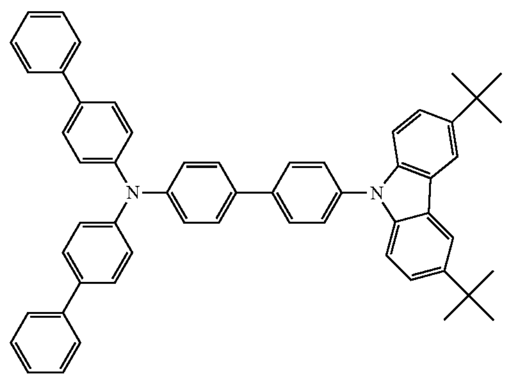
HT14
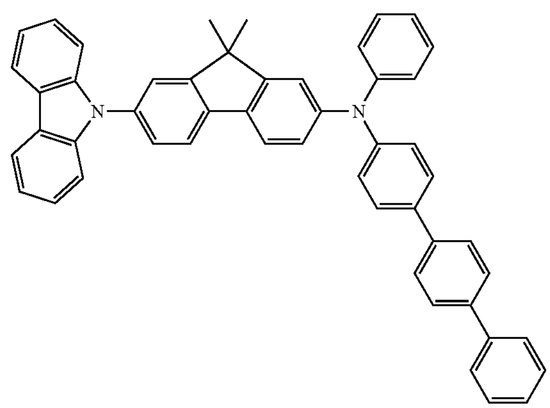
HT15
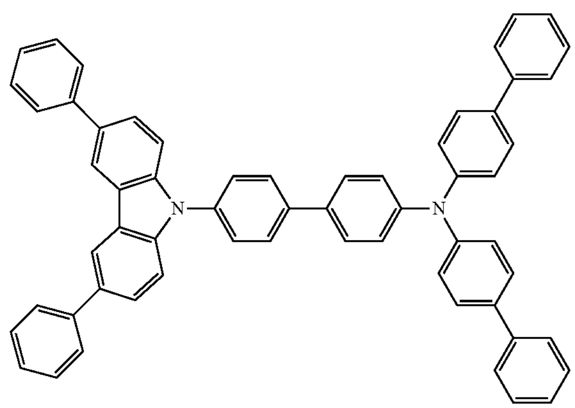
HT16
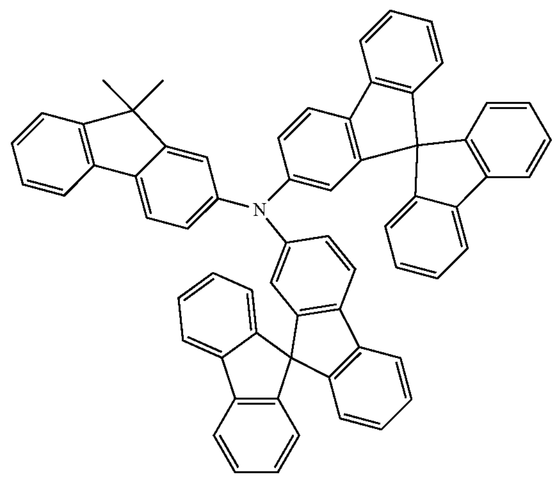
HT17
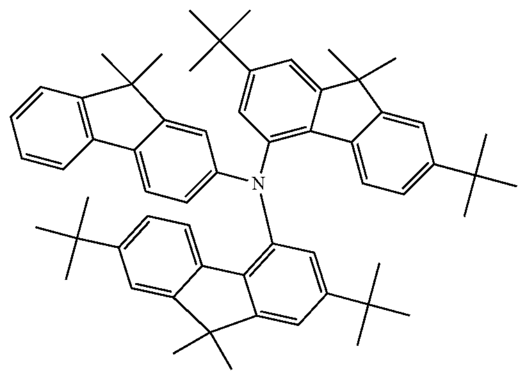
HT18
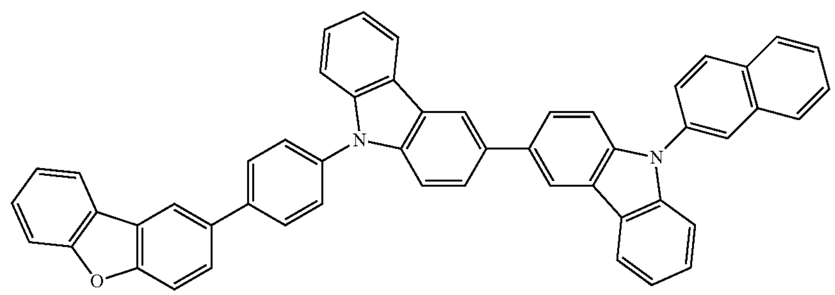

Hereinafter, specific examples of a light emitting material used for an organic light emitting device according to an embodiment of the present disclosure will be described. Examples of a light emitting material mainly contributing to a light emission function include condensed polycyclic compounds (such as fluorene derivatives, naphthalene derivatives, pyrene derivatives, perylene derivatives, tetracene derivatives, anthracene derivatives, and rubrene), quinacridone derivatives, coumarin derivatives, stilbene derivatives, organoaluminum complexes such as aluminum tris(8-quinolinolate), iridium complexes, platinum complexes, rhenium complexes, copper complexes, europium complexes, ruthenium complexes, and polymer derivatives such as poly(phenylenevinylene) derivatives, poly(fluorene) derivatives, and poly(phenylene) derivatives.

A light emitting layer host or light emission assist material included in the light emitting layer may be a condensed polycyclic compound. More specifically, the compound has an aryl group such as benzene, naphthalene, fluorene, benzofluorene, phenanthrene, chrysene, triphenylene, pyrene, fluoranthene, or benzofluoranthene. The aryl group may have an alkyl group. Specifically, the alkyl group may be an alkyl group having 1 to 12 carbon atoms. In addition to these compounds, other examples of the material include carbazole derivatives, dibenzofuran derivatives, dibenzothiophene derivatives, organoaluminum complexes such as aluminum tris(8-quinolinolate), and organoberyllium complexes.

The following are specific examples of the light emitting layer host material used for an organic light emitting device according to an embodiment of the present disclosure. However, the following compounds are merely specific examples and do not limit the present invention.

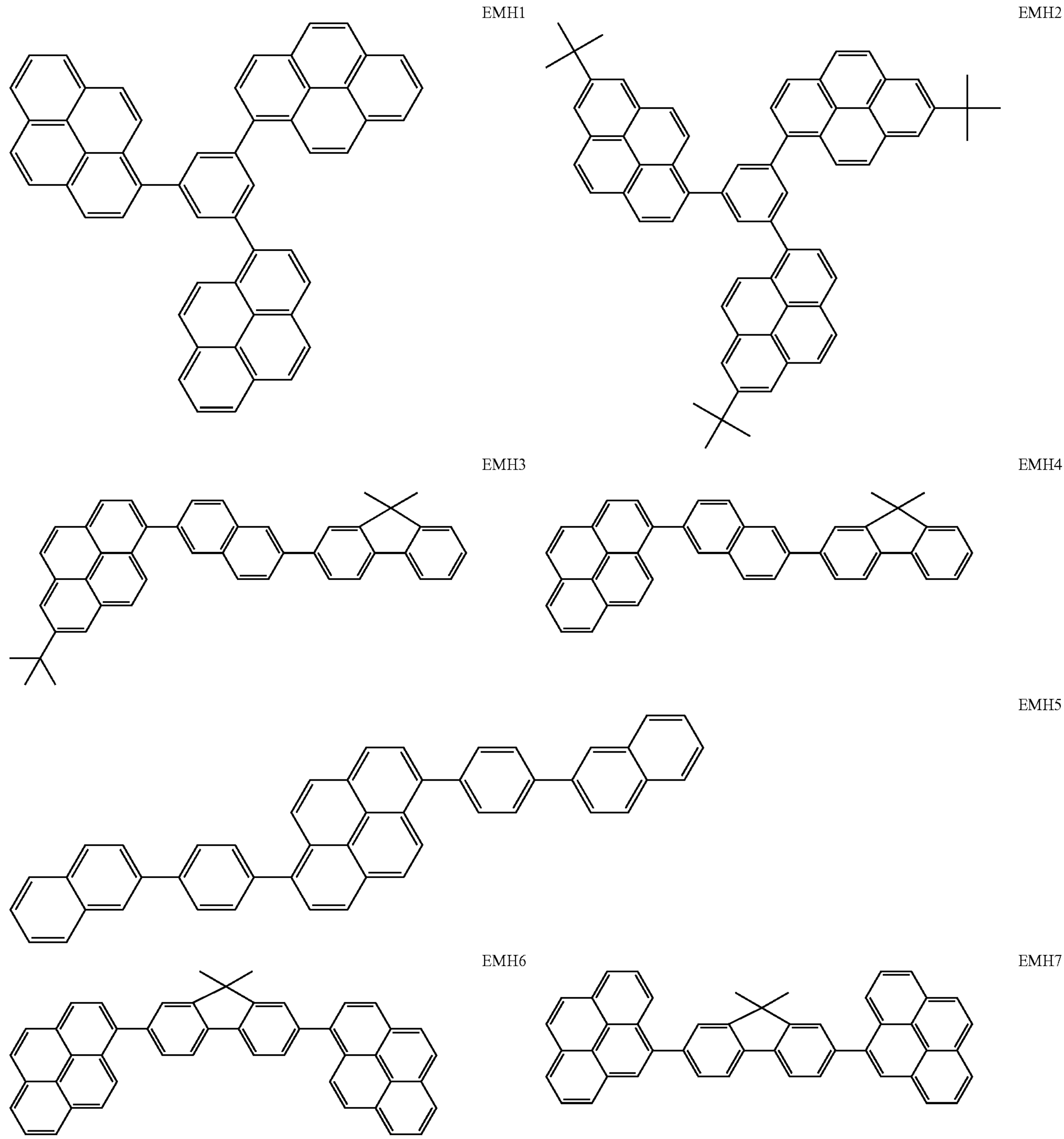

-continued
EMH8
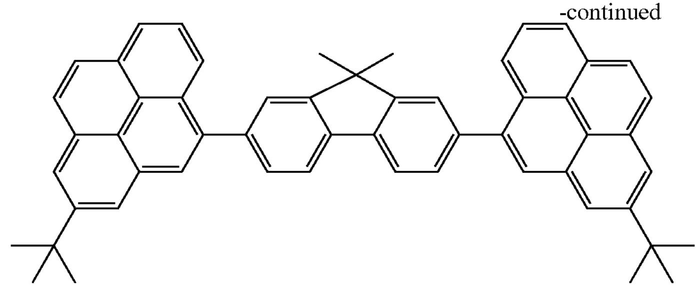
EMH9
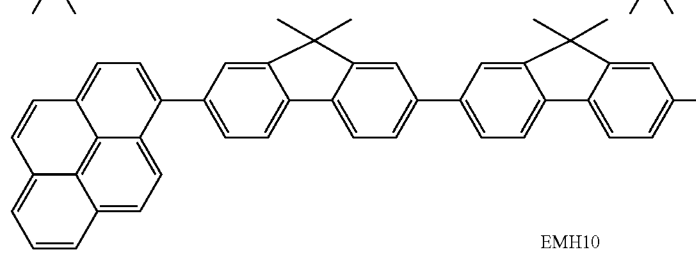
EMH10
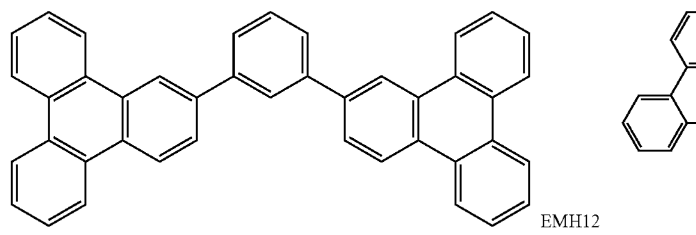
EMH11
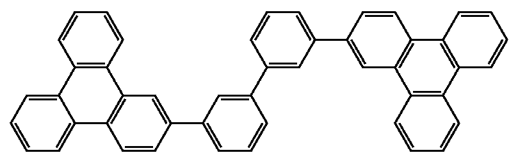
EMH12
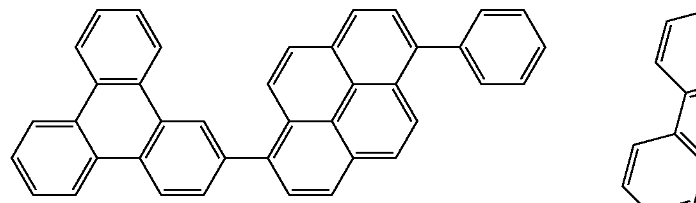
EMH13
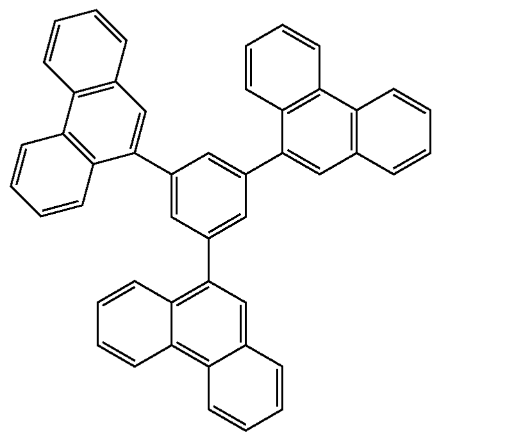
EMH14
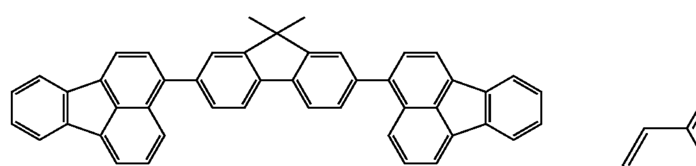
EMH15
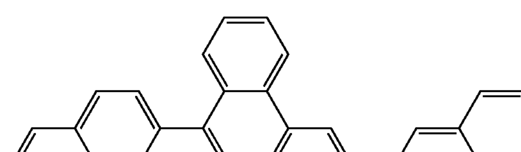
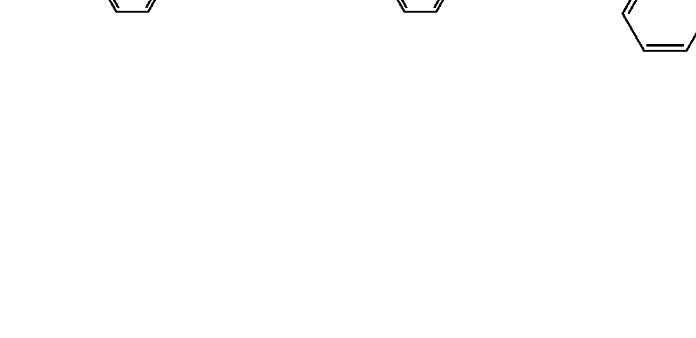
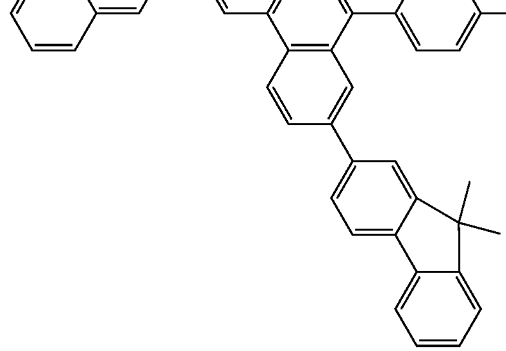

-continued
EMH16
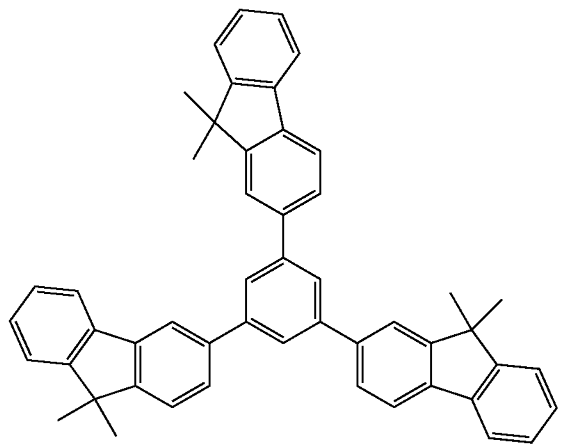
EMH17
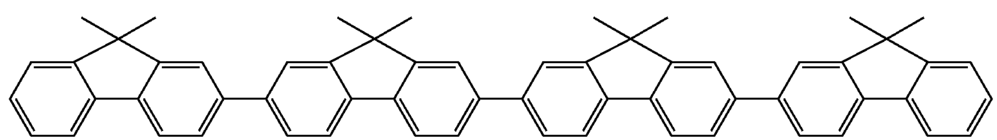
EMH18
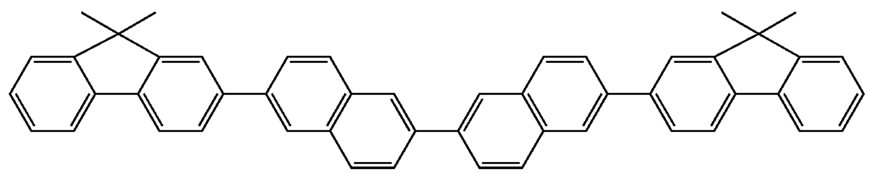
EMH19
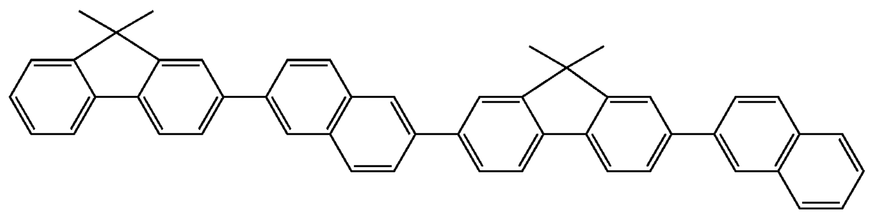
EMH20
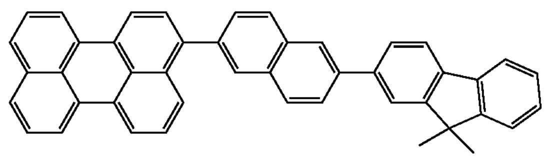
EMH21
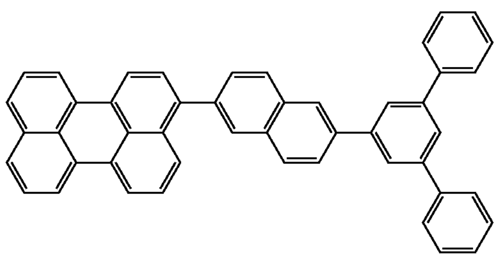
EMH22
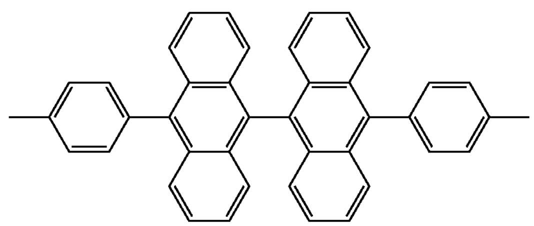
EMH23
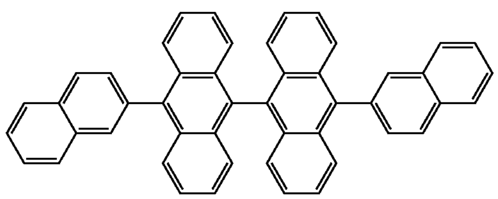

-continued
EMH24
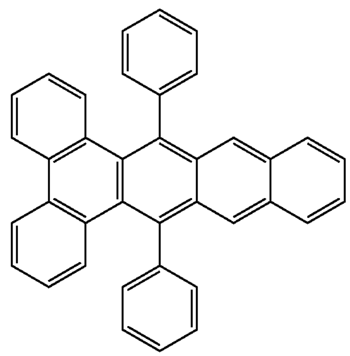
EMH25
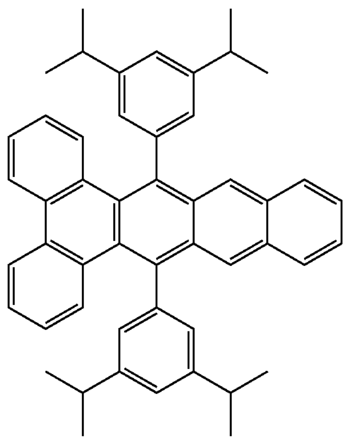
EMH26
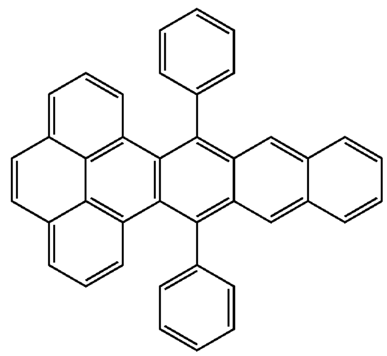
EMH27
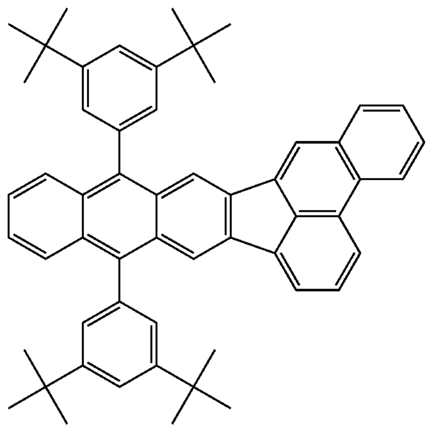
EMH28
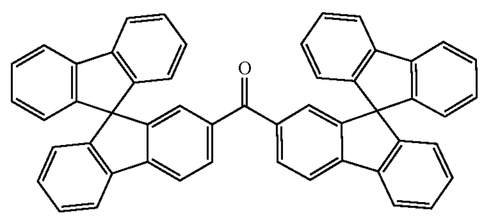
EMH29
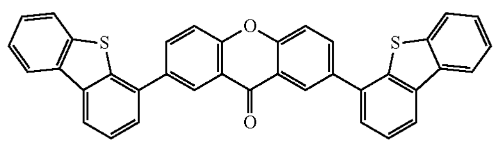
EMH30
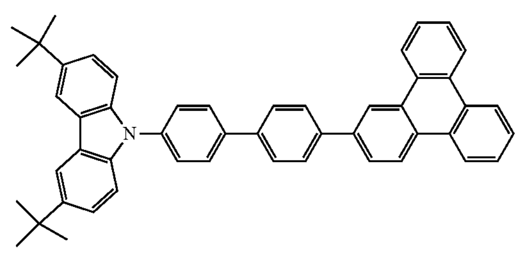
EMH31
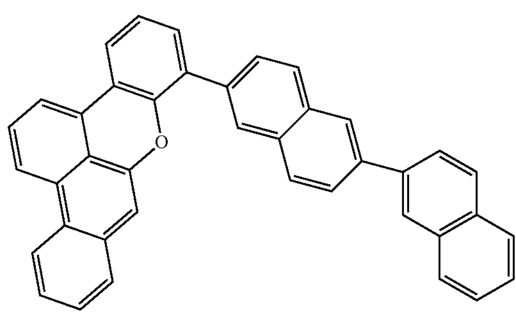

Among these host materials as examples, from the viewpoint of the above-described bonding stability, preferred are EMH1 to EMH27, which are constituted by hydrocarbons alone; more preferred are EMH1 to EMH21, which do not have acene structures such as anthracene and tetracene. This is because use of such host materials provides organic light emitting devices having good durability characteristics.

The following are examples of a blue dopant used for an organic light emitting device according to an embodiment of the present disclosure. However, the present invention is not limited to these examples.

BD1

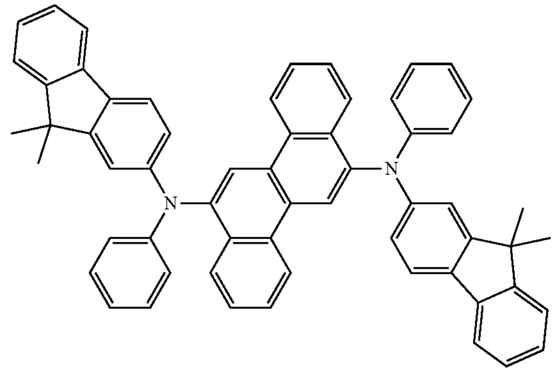

BD2

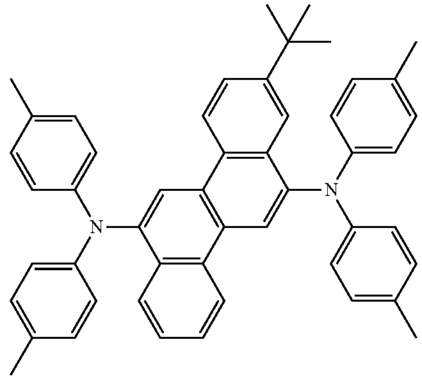

BD3

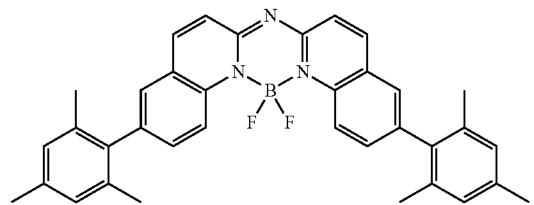

BD4

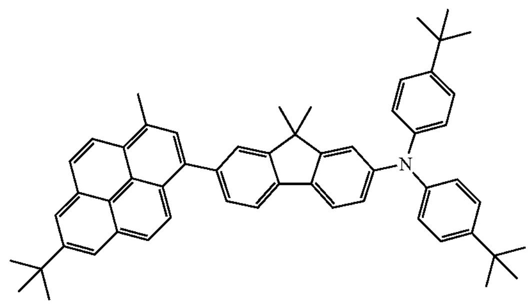

BD5

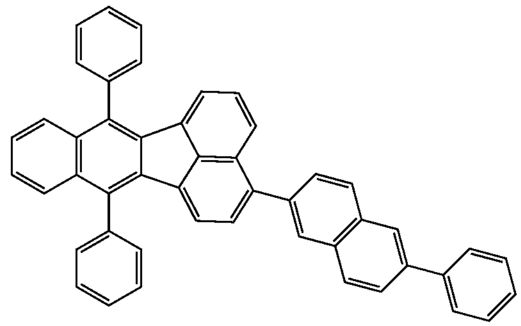

BD6

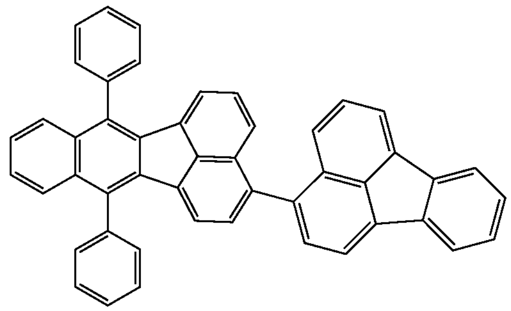

BD7

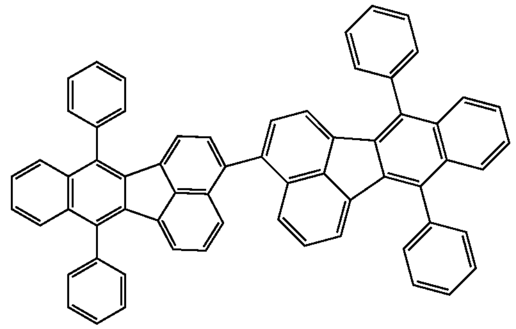

BD8

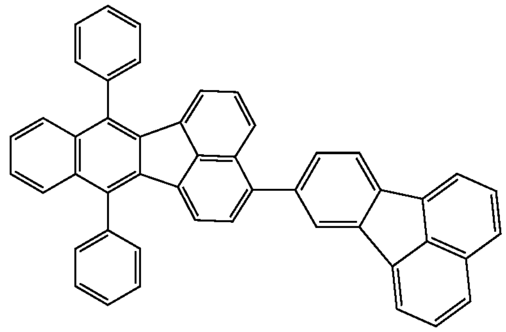

-continued
BD9
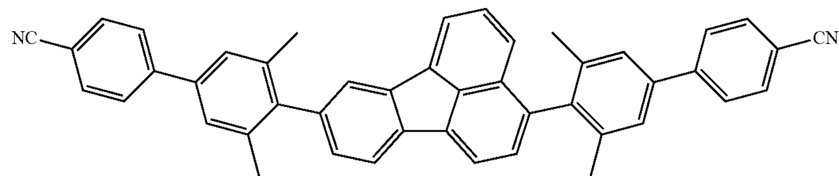
BD10
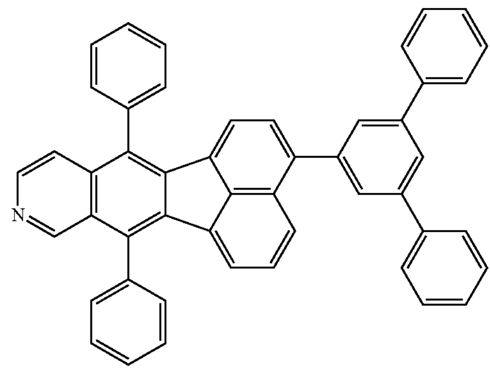
BD11
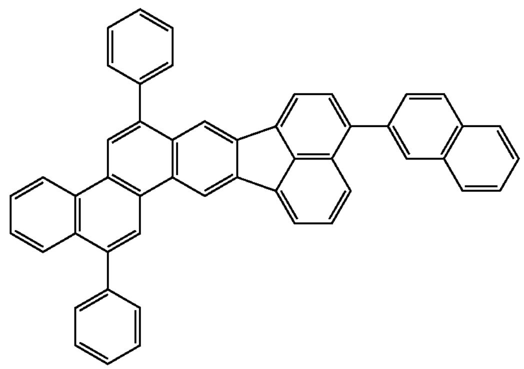
BD12
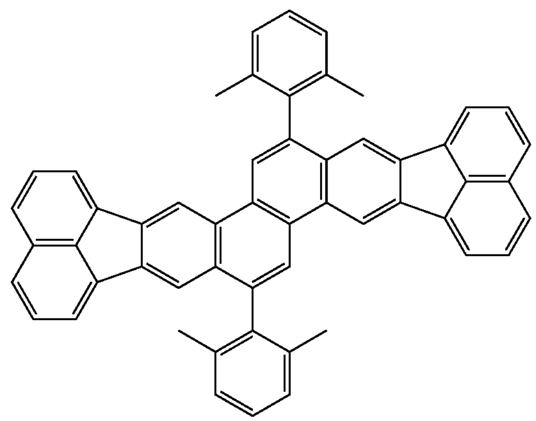
BD13
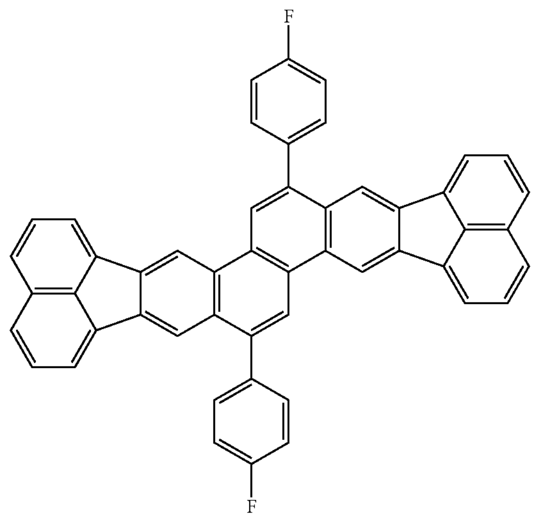
BD14
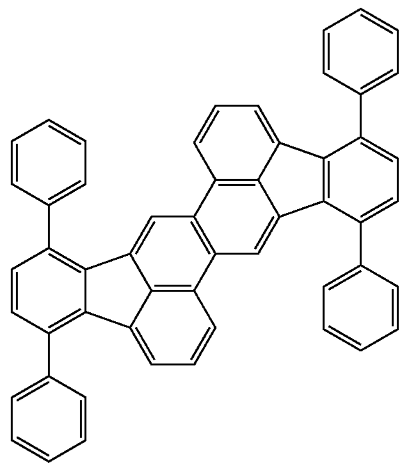
BD15
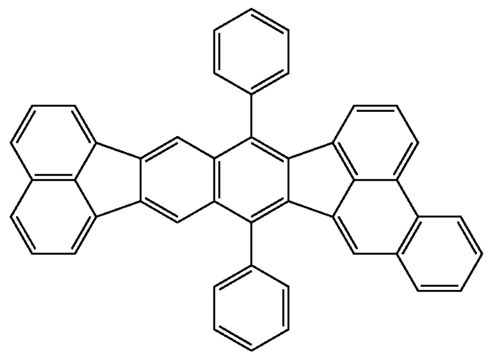

-continued
BD16
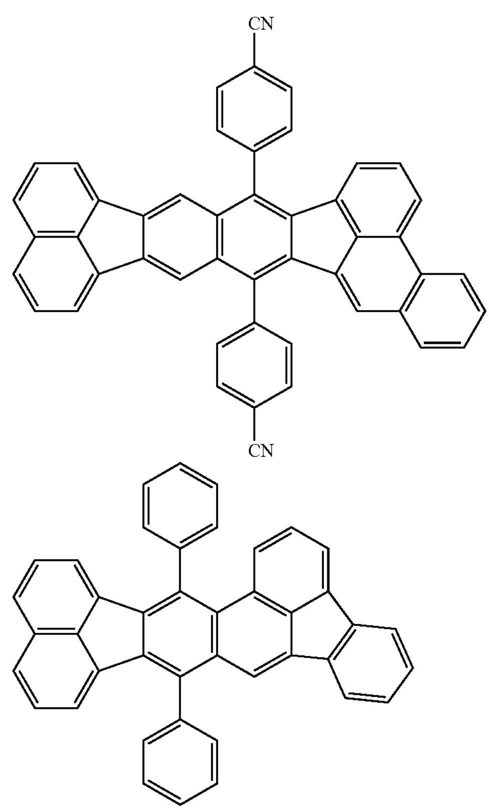
BD17
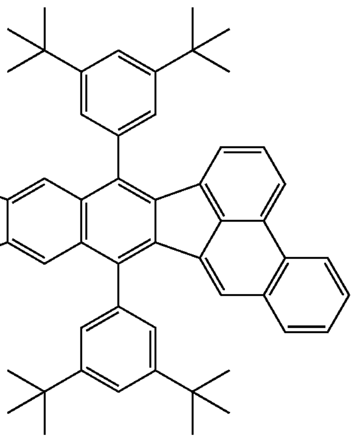
BD18
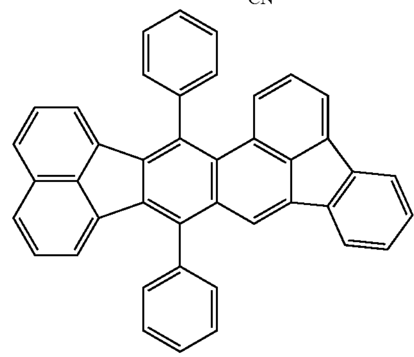
BD19
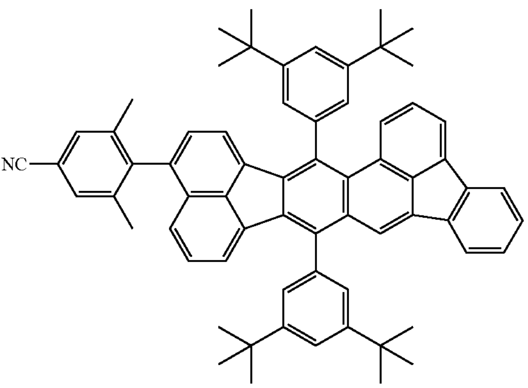
BD20
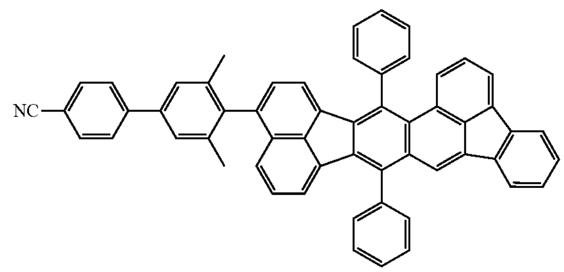
BD21
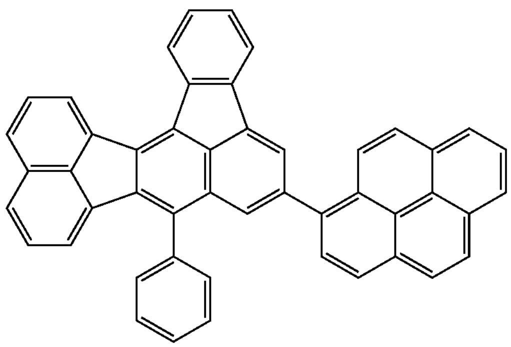
BD22
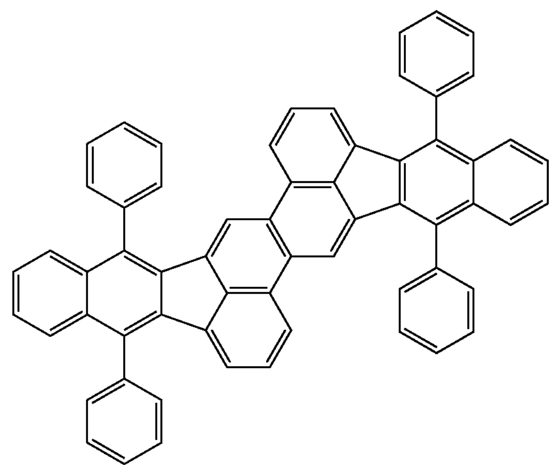
BD23
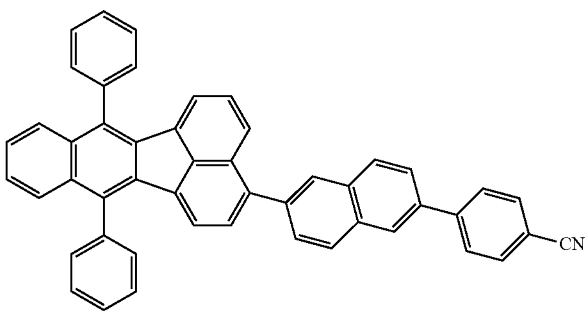

-continued

BD24

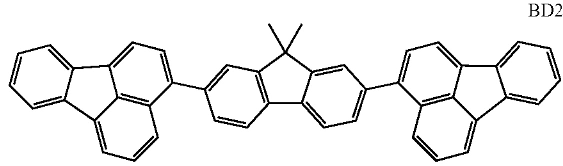

BD25

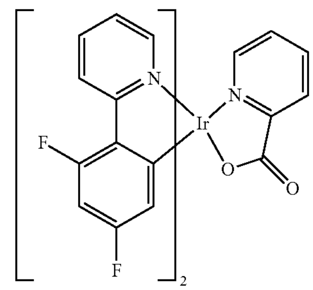

BD26

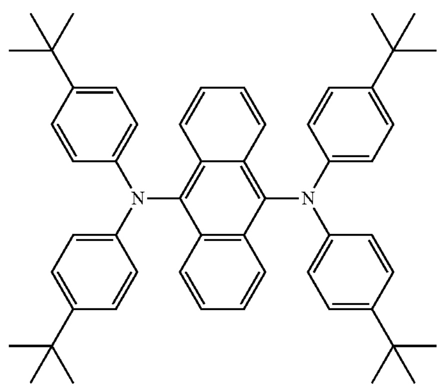

BD27

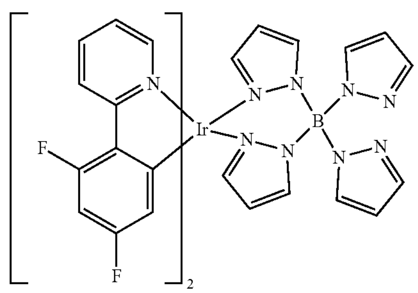

Among these examples of the blue dopant, particularly preferred are compounds not having substituted amino groups, which have low bond energy. The doping concentrations of such blue dopants are each desirably 0.1 to 10.0 wt %, more preferably 0.3 to 5.0 wt %.

The following are examples of a green dopant used for an organic light emitting device according to an embodiment of the present disclosure. However, the present invention is not limited to these examples.

GD1

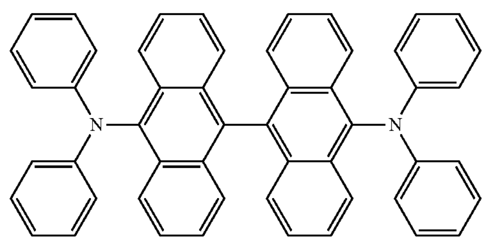

GD2

GD3

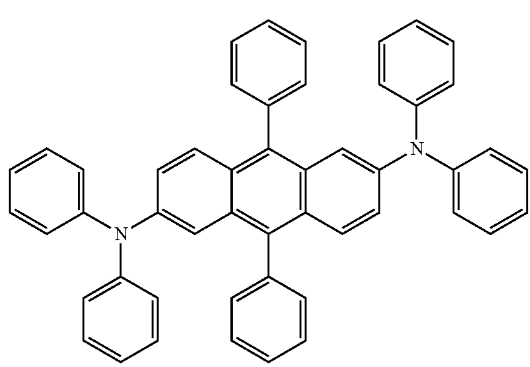

GD4

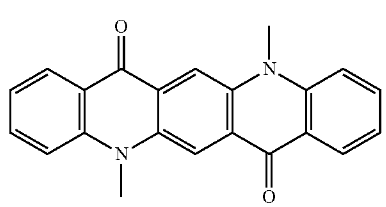

-continued
GD5
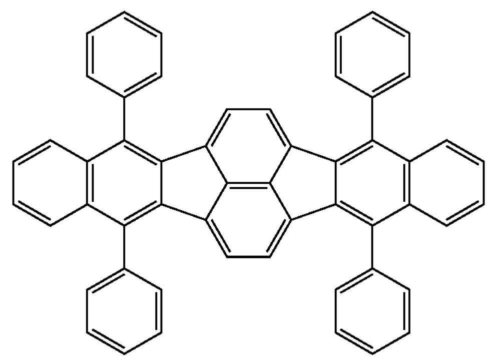
GD6
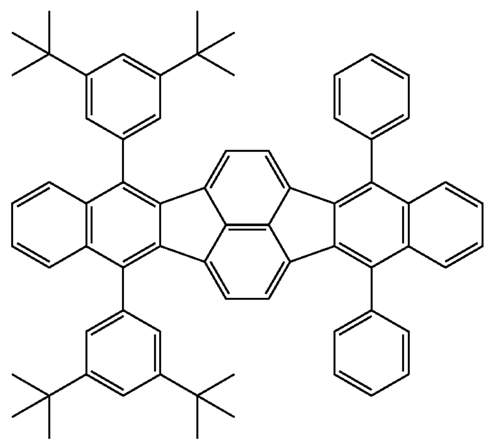
GD7
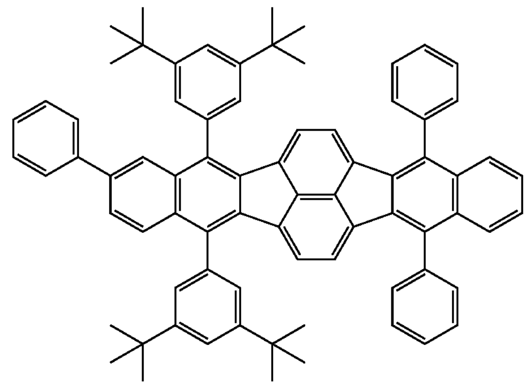
GD8
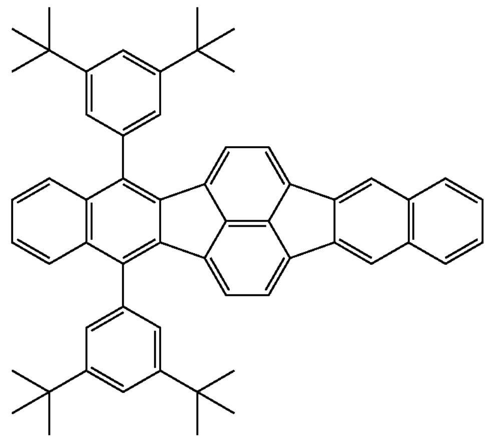
GD9
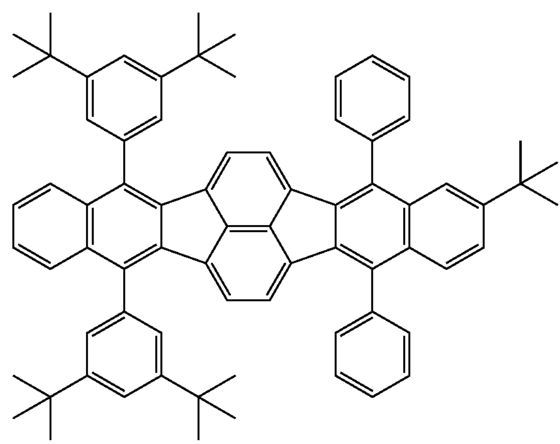
GD10
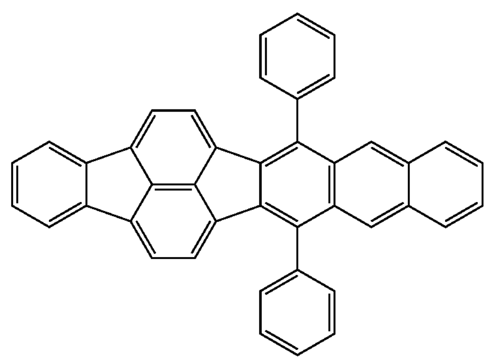

-continued
GD11
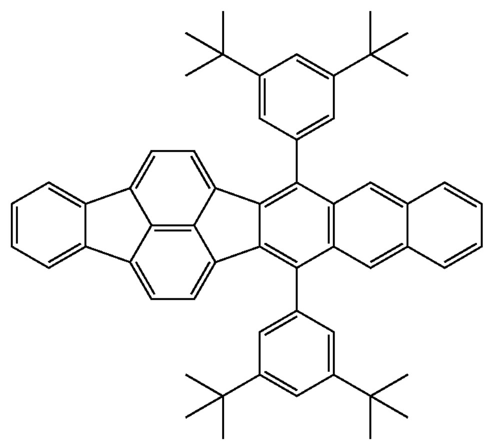
GD12
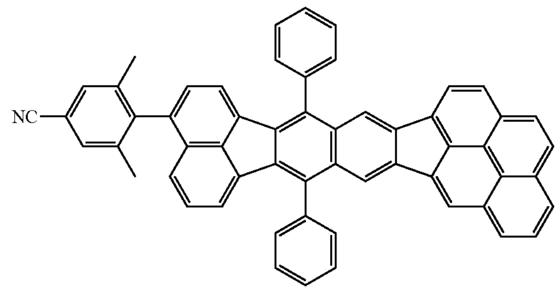
GD13
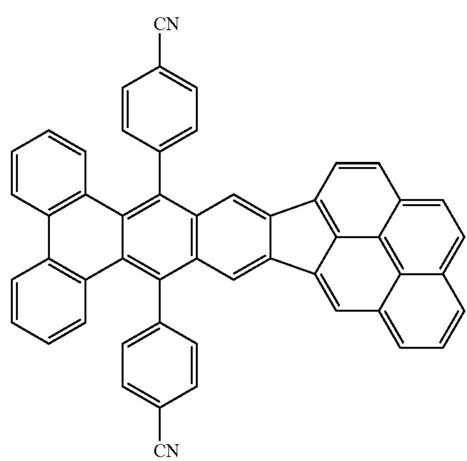
GD14
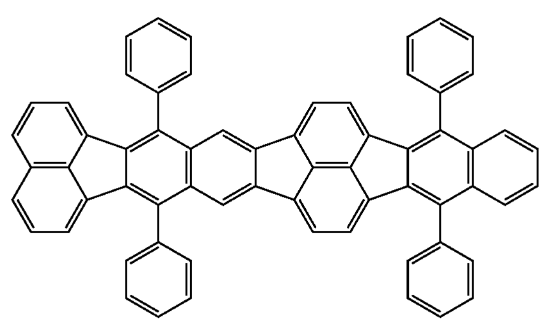
GD15
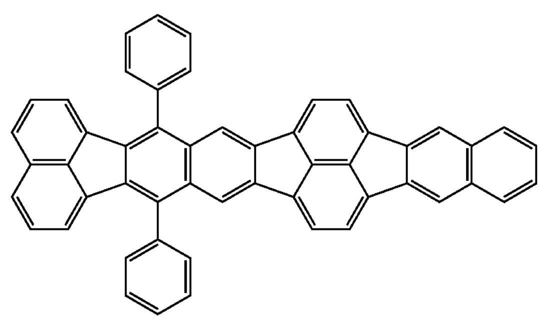
GD16
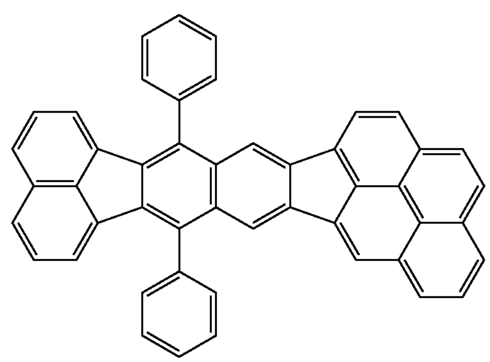
GD17
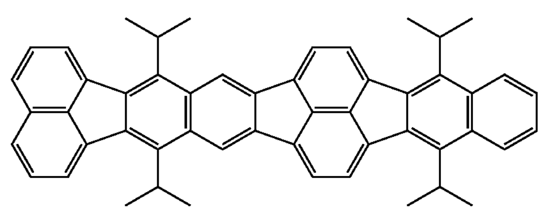
GD18
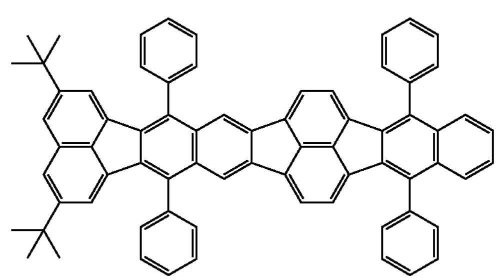

-continued

GD19

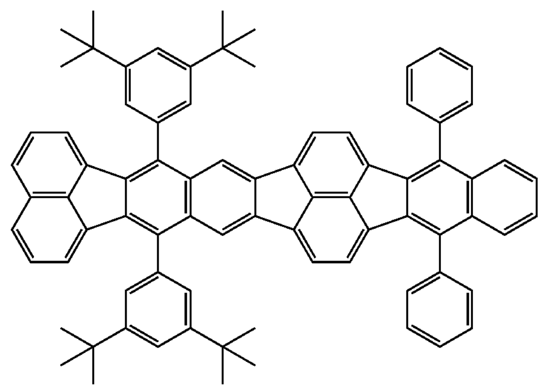

GD20

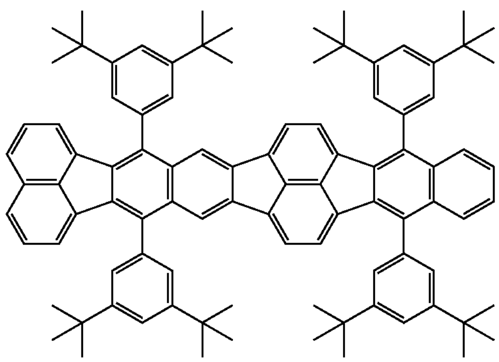

GD21

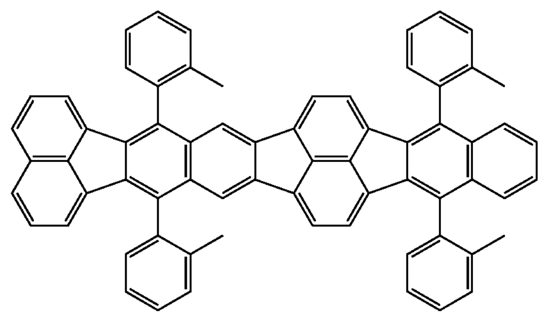

GD22

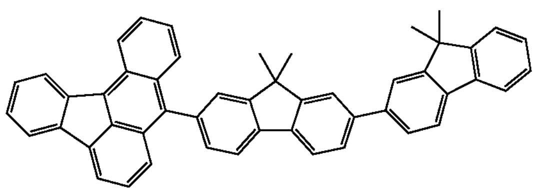

GD23

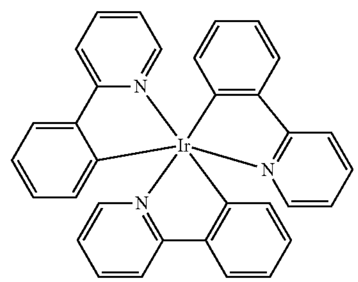

GD24

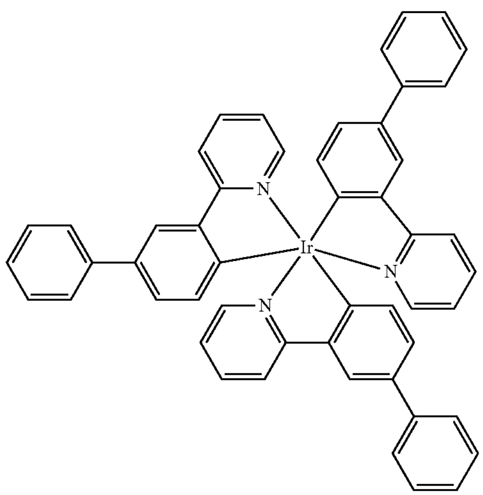

Among these examples of the green dopant, particularly preferred are compounds not having substituted amino groups, which have low bond energy. The doping concentrations of such green dopants are each desirably 0.1 to 10.0 wt %, more preferably 0.1 to 5.0 wt %.

The following are examples of a red dopant used for an organic light emitting device according to an embodiment of the present disclosure. However, the present invention is not limited to these examples.

RD1
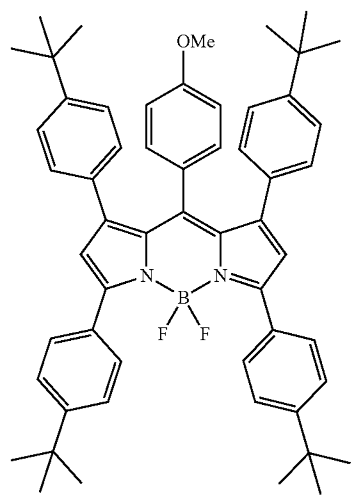
RD2
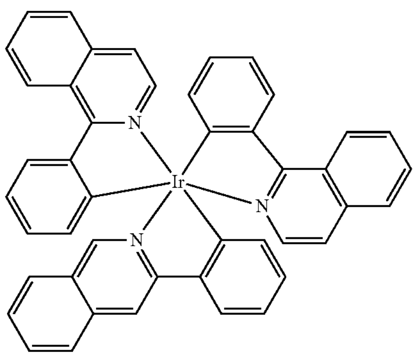
RD3
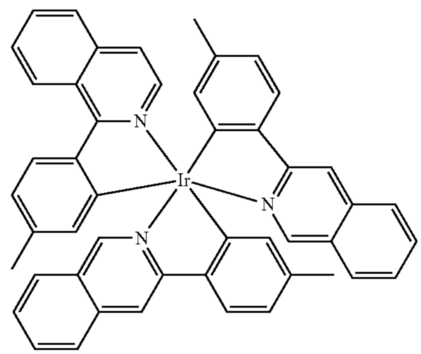
RD4
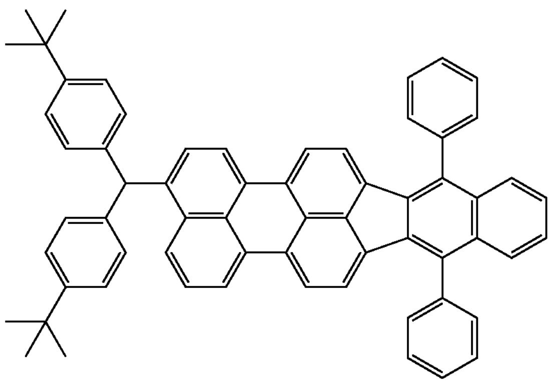
RD5
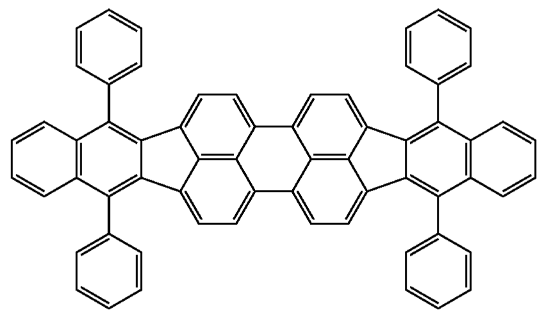
RD6
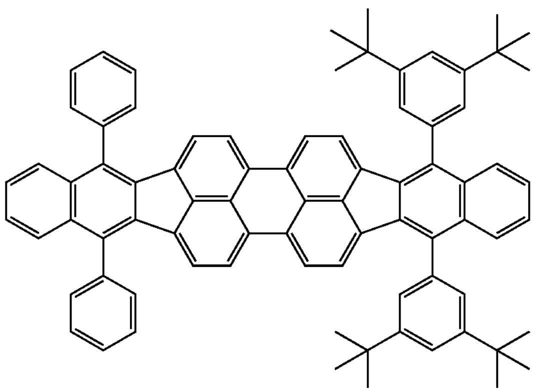
RD7
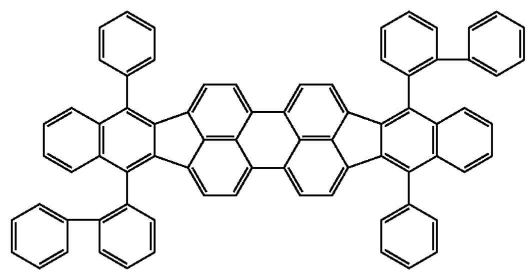
RD8
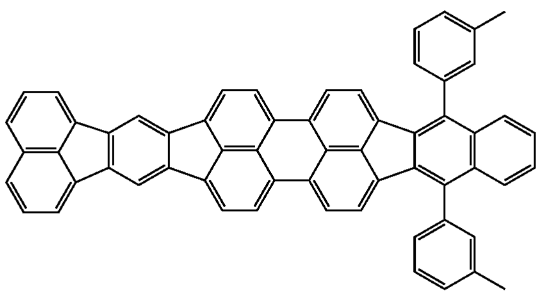

RD9
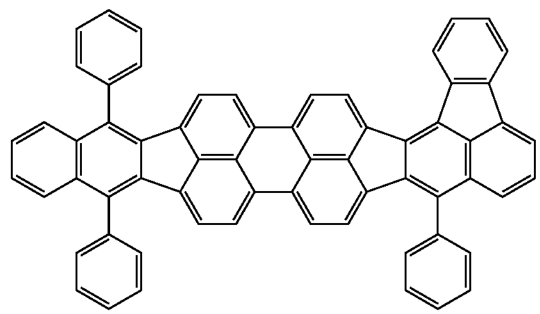
RD10
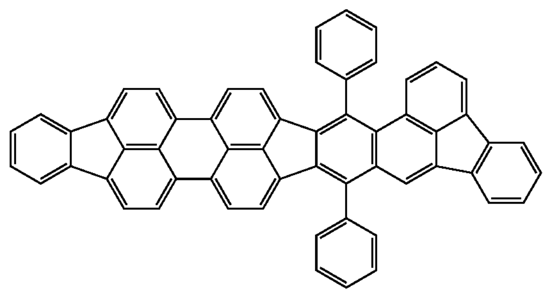
RD11
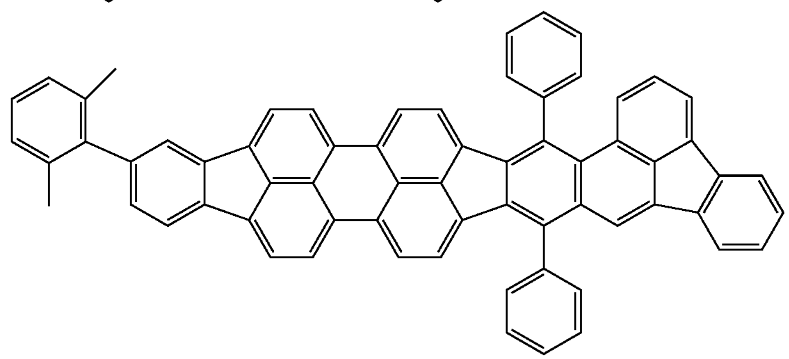
RD12
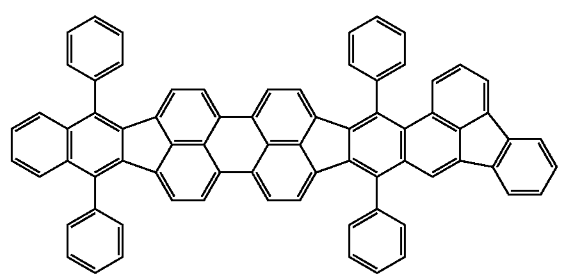
RD13
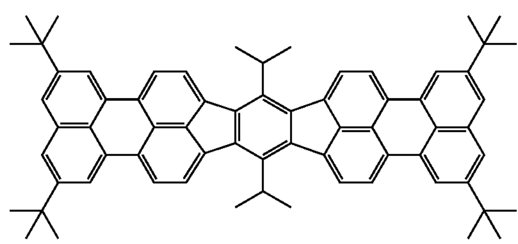
RD14
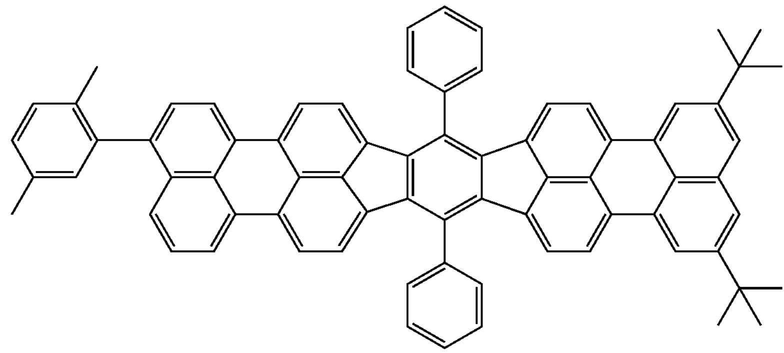
RD15
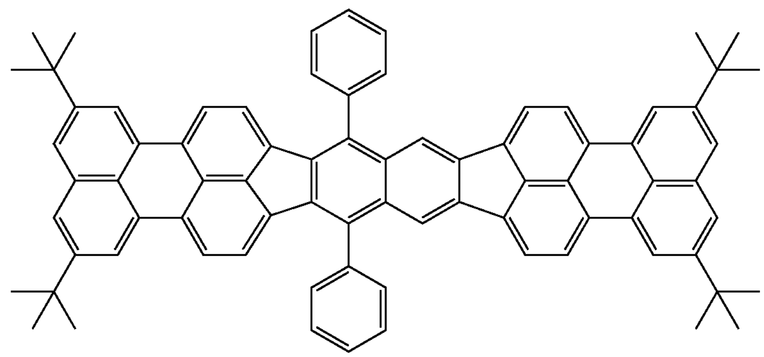

RD16
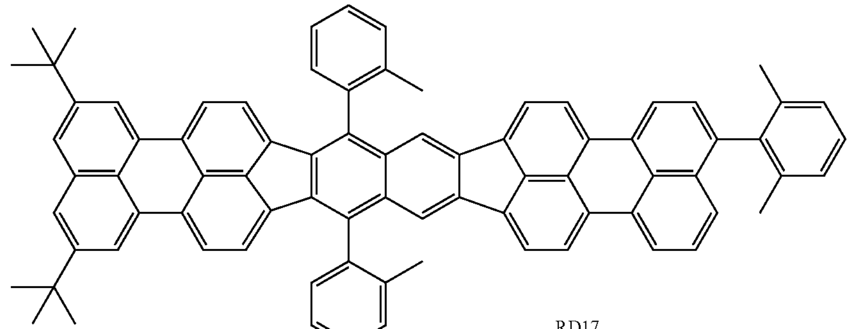
RD17
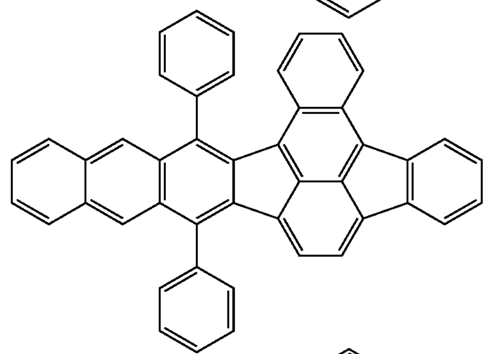
RD18
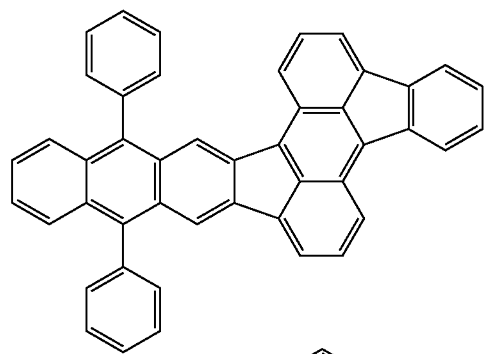
RD19
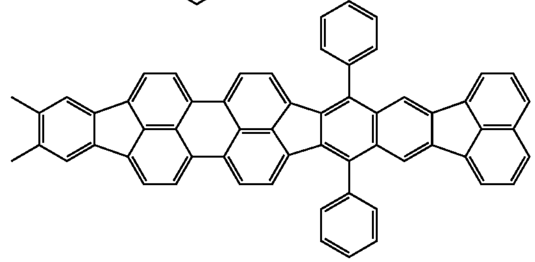
RD20
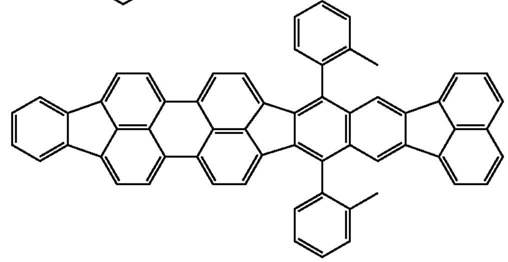
RD21
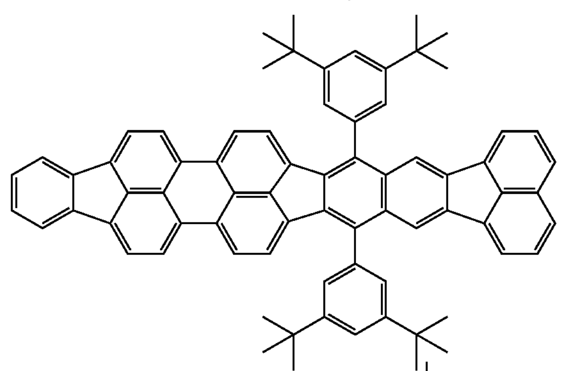
RD22
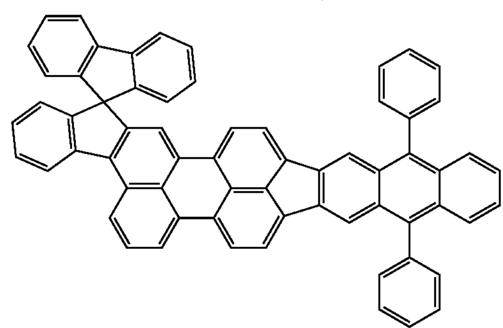
RD23
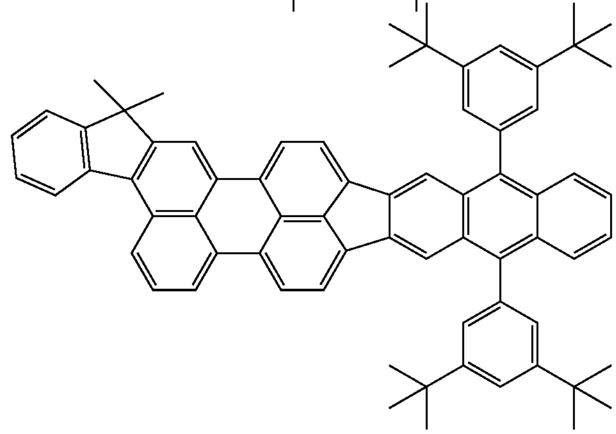

Among these examples of the red dopant, particularly preferred are compounds not having substituted amino groups, which have low bond energy. More preferred are compounds constituted by hydrocarbons alone. The doping concentrations of such red dopants are each desirably 0.1 to 5.0 wt %, more preferably 0.1 to 0.5 wt %.

Organic Light Emitting Device According to this Embodiment

The organic light emitting device according to this embodiment is an organic electric-field device including a pair of electrodes and an organic compound layer disposed between the pair of electrodes. The organic compound layer includes a light emitting layer.

The organic light emitting device according to this embodiment may include, in addition to the light emitting layer, for example, a hole injection layer, a hole transport layer, an electron blocking layer, a hole blocking layer, an electron transport layer, an electron injection layer, an intermediate layer, a charge generation layer, and a charge separation layer.

The following are examples of the configuration of the organic light emitting device:

Anode/First hole transport layer/Second hole transport layer/First light emitting layer/Electron transport layer/Electron injection layer/Cathode;

Anode/Hole injection layer/First hole transport layer/Second hole transport layer/First light emitting layer/Electron transport layer/Electron injection layer/Cathode;

Anode/Hole injection layer/First hole transport layer/Second hole transport layer/First light emitting layer/Hole blocking layer/Electron transport layer/Electron injection layer/Cathode;

Anode/Hole injection layer/First hole transport layer/Second hole transport layer/First light emitting layer/Second light emitting layer/Hole blocking layer/Electron transport layer/Electron injection layer/Cathode;

Anode/Hole injection layer/First hole transport layer/Second hole transport layer/First light emitting layer/Intermediate layer/Second light emitting layer/Hole blocking layer/Electron transport layer/Electron injection layer/Cathode; and Anode/Hole injection layer/First hole transport layer/Second hole transport layer/First light emitting layer/Second light emitting layer/Third light emitting layer/Hole blocking layer/Electron transport layer/Electron injection layer/Cathode.

However, these device configuration examples are mere basic device configurations. The configuration of the organic light emitting device according to an embodiment of the present invention is not limited to these examples.

Various layer configurations can be employed in which, for example, at the interface between an electrode and an organic compound layer, an insulating layer is disposed, or a bonding layer or an interferential layer is disposed.

A charge injection layer including the fifth material may be further disposed between the first electrode and the first charge transport layer. The absolute value of LUMO energy of the fifth material can be equal to or larger than the absolute value of HOMO energy of the first material or the absolute value of HOMO energy of the second material. Such features provide a configuration in which holes are injected.

The organic light emitting device according to this embodiment may have what is called a bottom emission configuration in which light is extracted through the substrate-side electrode, what is called a top emission configuration in which light is extracted on a side opposite from the substrate, or a configuration in which light is extracted through both of the surfaces.

Incidentally, in the present disclosure, the light emitting layer is a layer having a light emission function among organic compound layers disposed between the electrodes. The light emitting layer may include a host material, a dopant material, and an assist material. These materials may also be respectively referred to as a first material, a second material, and a third material.

The host material included in the light emitting layer may have the largest weight percentage among materials included in the light emitting layer. In this case, in other words, the host material is a material forming the matrix of the light emitting layer. More specifically, the host material may be, among materials included in the light emitting layer, a material having a weight percentage of 50 wt % or more in the light emitting layer.

The dopant material included in the light emitting layer may have a lower weight percentage than the host material among the materials included in the light emitting layer. More specifically, the dopant is a light emitting material that provides main light emission (light emission dopant material), and may provide light emission accounting for 50% or more of the region of the emission spectrum of the organic light emitting device. The dopant material may have, within the light emitting layer, a weight percentage of less than 50 wt % relative to materials included in the light emitting layer. The dopant material is also referred to as a guest material.

The dopant material is a compound that provides main light emission and included within the light emitting layer. Specifically, the light emission dopant provides light emission accounting for 50% or more of the region of the emission spectrum of the organic light emitting device.

The concentration of the dopant material relative to 100 wt % of all compounds constituting the light emitting layer is 0.01 wt % or more and less than 50 wt %, preferably 0.1 wt % or more and 10 wt % or less. More preferably, the concentration of the dopant material is 0.1 wt % or more and 10 wt % or less in order to suppress concentration quenching. The dopant material may be uniformly included throughout the layer formed of the host material, may be included to have a concentration gradient, or may be partially included in a specified region of the host material layer while another region is left so as not to include the dopant material.

Alternatively, the organic light emitting device according to this embodiment may be an organic light emitting device including a plurality of light emitting layers in which at least one of the plurality of light emitting layers is a light emitting layer that emits light rays of a wavelength different from that of another light emitting layer, and light rays from these light emitting layers are mixed to provide emission of light rays of white.

In an embodiment of the present disclosure, the organic light emitting device may include two or more light emitting layers; each light emitting layer may include light emitting materials that emit light rays of two or more colors.

A first light emitting layer and a second light emitting layer may be in contact with each other; alternatively, another compound layer may be disposed between these light emitting layers. The other compound layer may be a charge generation layer, for example. Configuration of organic light emitting device The organic light emitting device is provided by forming, on a substrate, an anode, an organic compound layer, and a cathode. On the cathode, for example, a protective layer and a color filter may be disposed. When the color filter is disposed, a planarization layer may be disposed between the protective layer and the color filter. The planarization layer may be formed of an acrylic resin, for example.

Substrate

The substrate may be, for example, quartz, glass, a silicon wafer, a resin, or a metal. On the substrate, a switching element such as a transistor and wiring may be disposed, and may be overlain by an insulating layer. The insulating layer is not limited in terms of material as long as a contact hole can be formed therein to ensure electrical connection between the anode 2 and wiring while the insulating layer ensures insulation between the anode 2 and another wiring not connected to the anode 2. Examples of the material include resins such as polyimide, silicon oxide, and silicon nitride.

Electrodes

The electrodes can be a pair of electrodes that are a first electrode and a second electrode. The pair of electrodes may be an anode and a cathode. When an electric field is applied in a direction in which the organic light emitting device emits light, one of the electrodes at a higher potential is the anode, and the other is the cathode. Stated another way, one of the electrodes that supplies holes to the light emitting layer is the anode, and the other electrode that supplies electrons to the light emitting layer is the cathode.

One of the pair of electrodes may be a reflective electrode that reflects light while the other may be a transmissive electrode that transmits light. In such a case of using the combination of the reflective electrode and the transmissive electrode, the thickness of the organic compound layer disposed between the pair of electrodes may be adjusted, to form an optical resonator structure. Alternatively, both of the pair of electrodes may be provided as transmissive electrodes.

The material constituting the anode can have a work function as high as possible. Examples of the material include elemental metals such as gold, platinum, silver, copper, nickel, palladium, cobalt, selenium, vanadium, and tungsten; mixtures including the foregoing; alloys of combinations of the foregoing; metal oxides such as tin oxide, zinc oxide, indium oxide, indium tin oxide (ITO), and indium zinc oxide; and conductive polymers such as polyaniline, polypyrrole, and polythiophene.

Such electrode substances may be used alone or in combination of two or more thereof. The anode may be constituted by a single layer or a plurality of layers.

When a reflective electrode is provided, it may be formed of, for example, chromium, aluminum, silver, titanium, tungsten, molybdenum, an alloy of the foregoing, or a stacked layer of the foregoing. When a transparent electrode is provided, non-limiting examples thereof include a transparent conductive oxide layer of indium tin oxide (ITO) or indium zinc oxide. Such electrodes can be formed by photolithography.

On the other hand, the cathode can be constituted by a material having a low work function. Examples of the material include alkali metals such as lithium; alkaline-earth metals such as calcium; elemental metals such as aluminum, titanium, manganese, silver, lead, and chromium; mixtures of the foregoing; alloys of combinations of these elemental metals such as magnesium-silver, aluminum-lithium, aluminum-magnesium, silver-copper, and zinc-silver; and metal oxides such as indium tin oxide (ITO). Such electrode substances may be used alone or in combination of two or more thereof. The cathode may be constituted by a single layer or a plurality of layers. In particular, silver is preferably employed; more preferably, in order to suppress aggregation of silver, a silver alloy is employed. As long as aggregation of silver is suppressed, the content ratio in the alloy is not limited, and may be, for example, 1:1.

The cathode is not particularly limited and may be formed as a conductive layer of an oxide such as ITO to provide a top emission device; alternatively, the cathode may be formed as a reflective electrode of, for example, aluminum (Al) to provide a bottom emission device. The method of forming the cathode is not particularly limited; however, for example, direct-current or alternating-current sputtering can be employed because the resultant film has a high coverage, which tends to achieve a reduction in the resistance.

Protective Layer

On the cathode, a protective layer may be disposed. For example, onto the cathode, a glass having a moisture absorbent is bonded, to thereby suppress ingress of, for example, water into the organic compound layers, to thereby suppress occurrence of display failures. In an alternative embodiment, on the cathode, a passivation film formed of, for example, silicon nitride is disposed to suppress ingress of, for example, water into the organic EL layer. For example, after formation of the cathode, the resultant article kept in a vacuum is transported into another chamber; CVD is performed to form a silicon nitride film having a thickness of 2 μm as the protective layer. Alternatively, after the film formation by CVD, atomic layer deposition (ALD) may be performed to form a protective layer.

Color Filter

On the protective layer, a color filter may be disposed. For example, a color filter may be formed on another substrate so as to correspond to the size of the organic light emitting device, and bonded to the substrate having the organic light emitting device. Alternatively, on the above-described protective layer, photolithography may be performed to form a patterned color filter. The color filter may be formed of a polymer.

Planarization Layer

A planarization layer may be disposed between the color filter and the protective layer. The planarization layer may be formed of an organic compound that has a low molecular weight or a high molecular weight, preferably a high molecular weight.

Such planarization layers may be disposed so as to overlie and underlie the color filter, and may be formed of the same or different materials. Specific examples of the materials include polyvinylcarbazole resins, polycarbonate resins, polyester resins, ABS resins, acrylic resins, polyimide resins, phenol resins, epoxy resins, silicone resins, and urea resins.

Counter Substrate

On the planarization layer, a counter substrate may be disposed. The counter substrate is disposed at the counter position for the above-described substrate, hence it is referred to as the counter substrate. The material forming the counter substrate may be the same as that of the above-described substrate.

Organic Layers

The organic compound layers (such as a hole injection layer, a hole transport layer, an electron blocking layer, a light emitting layer, a hole blocking layer, an electron transport layer, and an electron injection layer) constituting an organic light emitting device according to an embodiment of the present disclosure are formed by the following method.

The organic compound layers constituting an organic light emitting device according to an embodiment of the present disclosure can be formed by a dry process such as vacuum deposition, ion plating, sputtering, or plasma CVD. Alternatively, instead of the dry process, a wet process may also be employed: the compounds are dissolved in appropriate solvents and applied by a publicly known coating process (such as spin coating, dipping, casting, an LB process, or an ink jet process) to form the layers.

When the layers are formed by, for example, vacuum deposition or a coating process using solutions, the layers tend not to undergo, for example, crystallization and have high stability over time. When the coating process is used to form films, the compounds may be combined with appropriate binder resins for forming the films.

Non-limiting examples of the binder resins include polyvinylcarbazole resins, polycarbonate resins, polyester resins, ABS resins, acrylic resins, polyimide resins, phenol resins, epoxy resins, silicone resins, and urea resins.

Such binder resins may be used alone as a homopolymer or a copolymer, or in combination of two or more thereof. The compounds may be optionally combined with additives such as publicly known plasticizers, antioxidants, and ultraviolet absorbents. Applications of organic light emitting device according to embodiment of present disclosure An organic light emitting device according to an embodiment of the present disclosure can be used as a constituent member for a display apparatus or an illumination apparatus, and is also applicable to, for example, the exposure light source of an electrophotographic image-forming apparatus, the backlight of a liquid crystal display apparatus, or a light emitting apparatus in which a white light source is equipped with a color filter.

The display apparatus may be an image information processing apparatus including an image input section configured to input image information from, for example, an area CCD, a linear CCD, or a memory card, and an information processing section configured to process the inputted information, and configured to display the inputted image on a display unit.

An image pickup apparatus or an ink jet printer may have a display unit having a touch panel function. The operation type of this touch panel function is not particularly limited, and may be an infrared type, a capacitance type, a resistive film type, or an electromagnetic induction type. The display apparatus may be used as a display unit of a multifunctional printer.

Hereinafter, the display apparatus according to this embodiment will be described with reference to a drawing. The display apparatus according to this embodiment includes a plurality of pixels, and at least one of the plurality of pixels includes an organic light emitting device according to an embodiment of the present disclosure and a transistor connected to the organic light emitting device.

Figure 3:
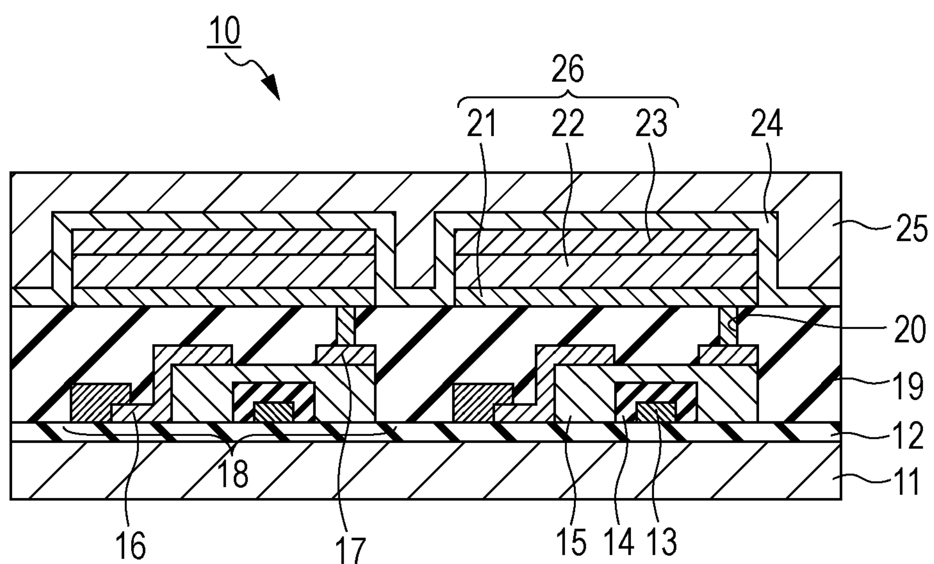
FIG. 3 is a schematic sectional view illustrating an example of a display apparatus including an organic light emitting device according to an embodiment of the present disclosure.

FIG. 3 is a schematic sectional view illustrating an example of a display apparatus including an organic light emitting device and an active element connected to the organic light emitting device. The active element may be a transistor or TFT composed of, for example, polysilicon or oxide semiconductors.

Referring to FIG. 3, a display apparatus 10 includes a substrate 11 formed of, for example, glass, and an insulating layer 12 formed on the substrate 11 to protect the transistor element or organic compound layers. The display apparatus 10 includes, on the insulating layer 12, a transistor element 18 including a gate electrode 13, a gate insulating film 14, a semiconductor layer 15, a drain electrode 16, and a source electrode 17.

The display apparatus includes, on the transistor element, an organic light emitting device 26 with an interlayer insulating layer 19 therebetween. The organic light emitting device 26 includes an anode 21, an organic compound layer 22 including a light emitting layer, and a cathode 23.

In the interlayer insulating layer 19, a contact hole 20 is formed. The anode 21, which constitutes the organic light emitting device, and the source electrode 17 are connected to each other via the contact hole.

Incidentally, the configuration of electric connections of electrodes (anode and cathode) included in the organic light emitting device and electrodes (source electrode and drain electrode) included in the transistor is not limited to the configuration illustrated in FIG. 3. In other words, any configuration may be employed as long as one of the anode and the cathode is electrically connected to one of the source electrode and the drain electrode of the transistor element.

FIG. 3 illustrates, in the display apparatus 10, an organic compound layer 22 like a single layer; however, the organic compound layer 22 may include a plurality of layers. On the cathode 23, a first protective layer 24 and a second protective layer 25 are disposed for suppressing deterioration of the organic light emitting device.

In FIG. 3, the display apparatus 10 employs, as the switching elements, transistors; alternatively, other elements may be employed as the switching elements.

In FIG. 3, in the display apparatus 10, the transistors are not limited to transistors using a single-crystal silicon wafer, and may be thin-film transistors having an active layer on the insulating surface of the substrate. The active layer may be formed of single-crystal silicon, a non-single-crystal silicon such as amorphous silicon or microcrystal silicon, or a non-single-crystal oxide semiconductor such as indium zinc oxide or indium gallium zinc oxide. Incidentally, thin-film transistors are also referred to as TFT elements.

In FIG. 3, the transistors included in the display apparatus 10 may be formed within the substrate such as a Si substrate. The phrase "formed within the substrate" means that the substrate itself such as a Si substrate is processed to form transistors. In other words, the configuration in which transistors are included within the substrate can also be regarded as a configuration in which the substrate and the transistors are formed as a single unit. Whether transistors are formed within the substrate or TFTs are formed depends on the size of the display unit. For example, when the display unit has a size of about 0.5 inches, the organic light emitting device can be formed on a Si substrate.

The organic light emitting device according to this embodiment is controlled, in terms of emission luminance, by transistors as examples of switching elements. A plurality of such organic light emitting devices are arranged in a plane, to emit light rays at individual emission luminances to thereby display images.

Figure 4:
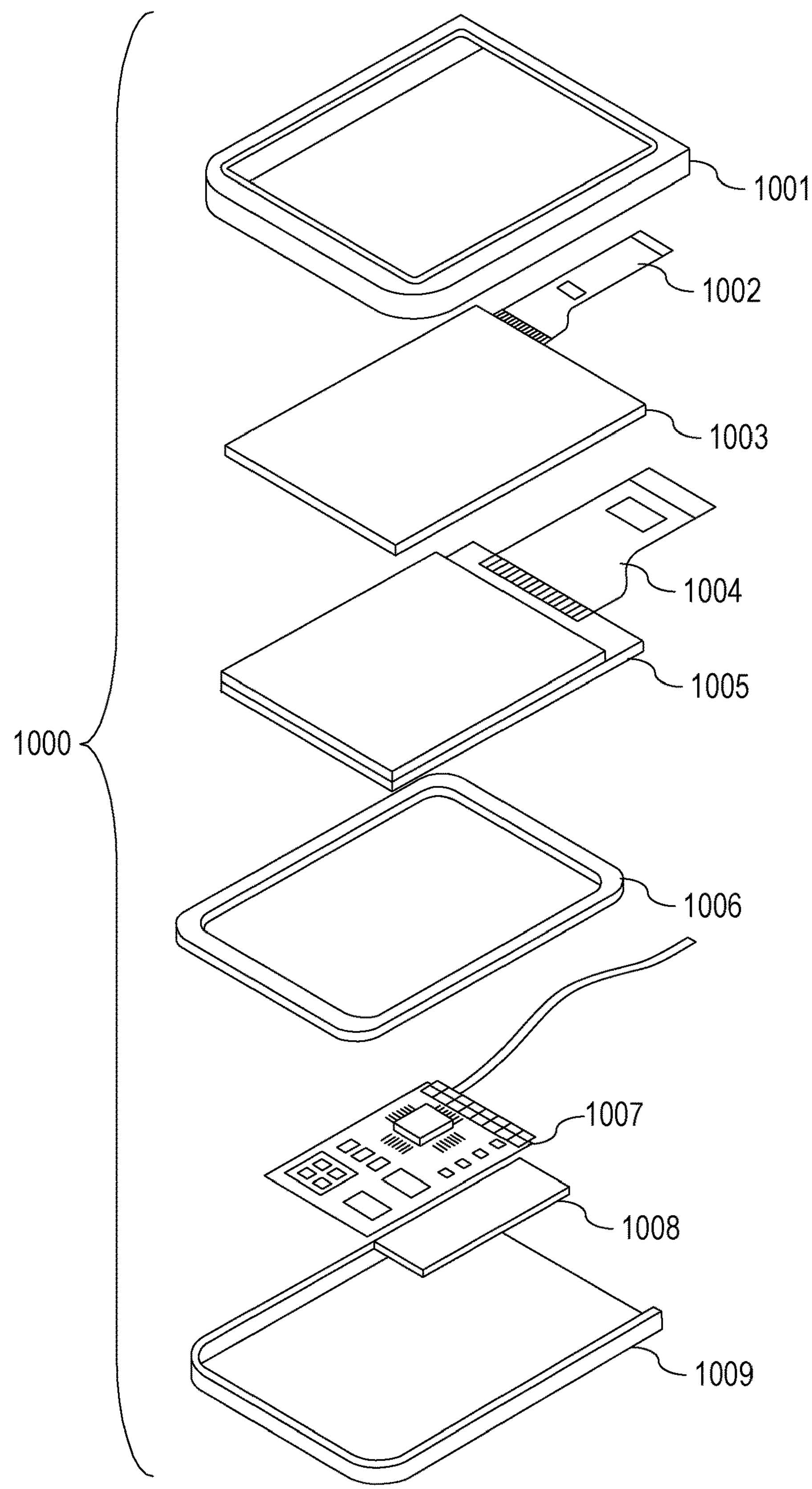
FIG. 4 is a schematic view illustrating an example of a display apparatus according to an embodiment of the present disclosure.

FIG. 4 is a schematic view illustrating an example of a display apparatus according to an embodiment. A display apparatus 1000 may include, between an upper cover 1001 and a lower cover 1009, a touch panel 1003, a display panel 1005, a frame 1006, a circuit substrate 1007, and a battery 1008. To the touch panel 1003 and the display panel 1005, flexible printed circuit FPCs 1002 and 1004 are respectively connected. On the circuit substrate 1007, transistors are formed by printing. The battery 1008 may not be installed when the display apparatus is not a mobile apparatus. When the display apparatus is a mobile apparatus, the battery 1008 may be installed in another position.

A display apparatus according to this embodiment may be used as a display unit of an image pickup apparatus including an optical unit including a plurality of lenses and an image pickup device configured to receive light having passed through the optical unit. The image pickup apparatus may include a display unit configured to display information obtained by the image pickup device. The display unit may be a display unit exposed outside of the image pickup apparatus, or a display unit disposed within the finder. The image pickup apparatus may be a digital camera or a digital video camera. The image pickup apparatus can also be referred to as a photoelectric conversion apparatus.

Figure 5A:
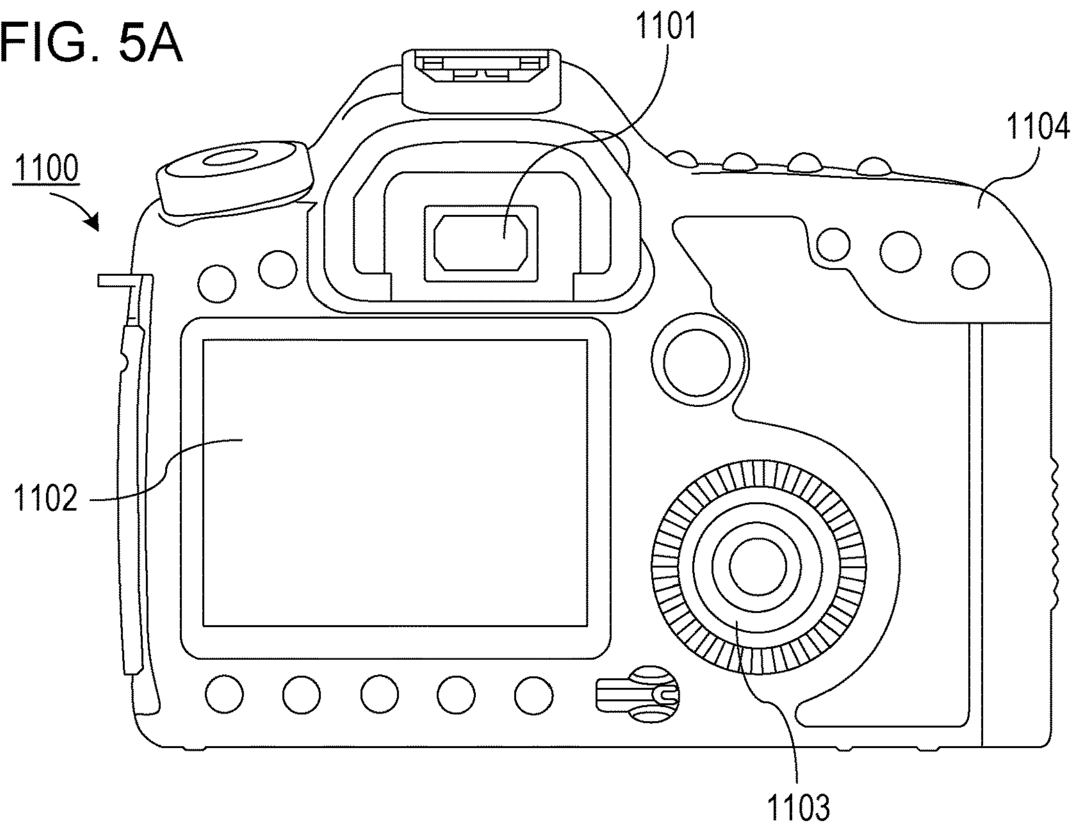
FIG. 5A is a schematic view illustrating an example of an image pickup apparatus according to an embodiment of the present disclosure.

FIG. 5A is a schematic view illustrating an example of an image pickup apparatus according to an embodiment. An image pickup apparatus 1100 may include a view finder 1101, a rear surface display 1102, an operation unit 1103, and a housing 1104. The view finder 1101 may include the display apparatus according to this embodiment. In this case, the display apparatus may display not only an image to be captured, but also, for example, environmental information and image capture instructions. Examples of the environmental information include the intensity of external light, the orientation of external light, the moving speed of the subject, and the probability that the subject may hide behind an obstacle.

Since the timing suitable for capturing an image lasts for a very short period, the information is desirably displayed with minimum delay. Thus, a display apparatus employing an organic light emitting device according to an embodiment of the present disclosure can be used because the organic light emitting device responds at a high speed. The display apparatus employing the organic light emitting device can be more suitably used for such image pickup apparatuses required to display images at high speed than liquid crystal display apparatuses.

The image pickup apparatus 1100 includes an optical unit (not shown). The optical unit includes a plurality of lenses and is configured to form an image in the image pickup device contained within the housing 1104. The plurality of lenses can be adjusted in terms of relative positions, to thereby adjust the focus. This operation can also be performed automatically.

The display apparatus according to this embodiment may include red, green, and blue color filters. These red, green, and blue color filters may be arranged in a delta array.

The display apparatus according to this embodiment may be used for a display unit of a portable terminal. In this case, the display apparatus may have both of a display function and an operation function. Examples of the portable terminal include cellular phones such as smartphones, tablets, and head mount displays.

Figure 5B:
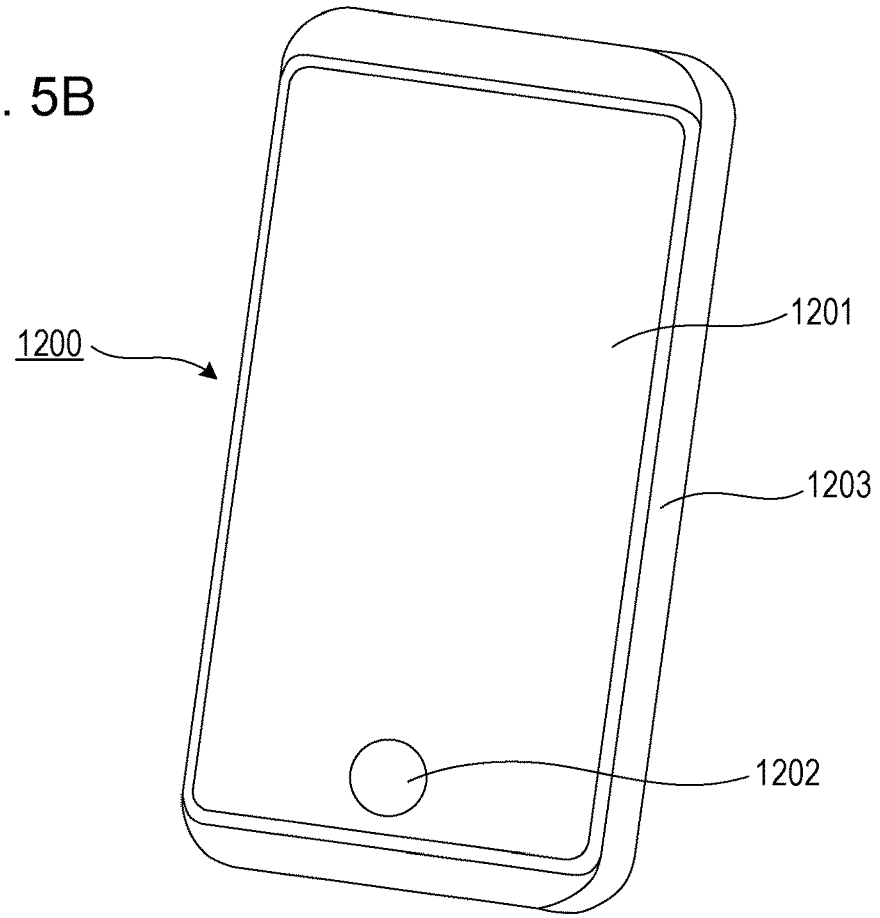
FIG. 5B is a schematic view illustrating an example of an electronic apparatus according to an embodiment of the present disclosure.

FIG. 5B is a schematic view illustrating an example of an electronic apparatus according to an embodiment. An electronic apparatus 1200 includes a display unit 1201, an operation unit 1202, and a housing 1203. The housing 1203 may include circuits, a printed substrate including the circuits, a battery, and a communication unit. The operation unit 1202 may be a button or a touch-panel-type sensor unit. The operation unit may be a biometric unit configured to scan a fingerprint for unlocking, for example. Such an electronic apparatus including a communication unit can also be referred to as a communication apparatus.

Figure 6A:
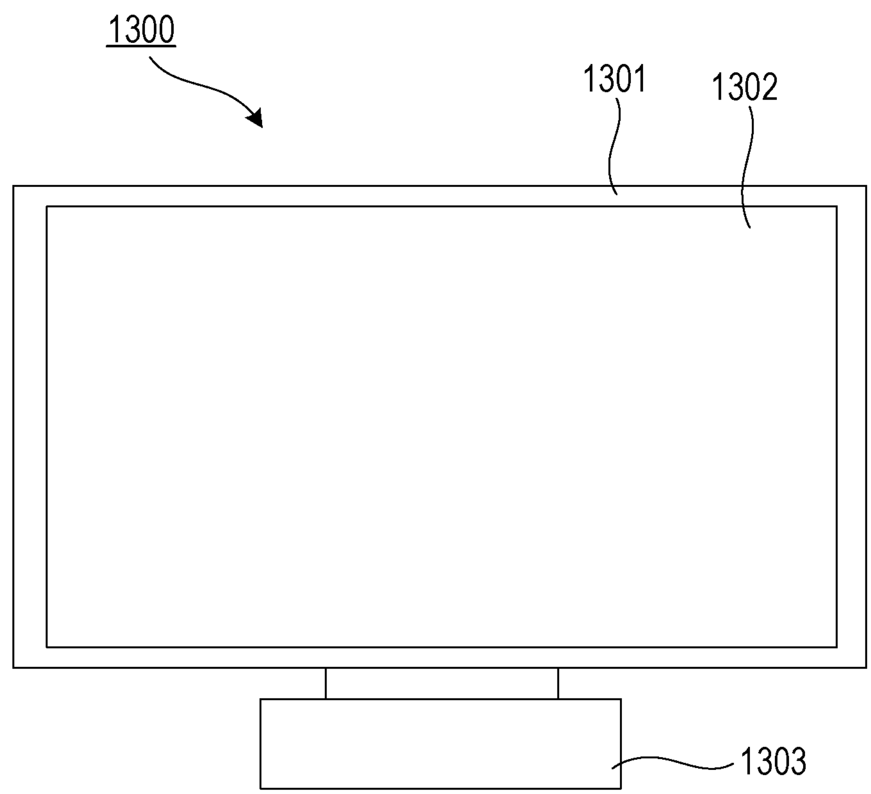
FIG. 6A is a schematic view illustrating an example of a display apparatus according to an embodiment of the present disclosure.
Figure 6B:
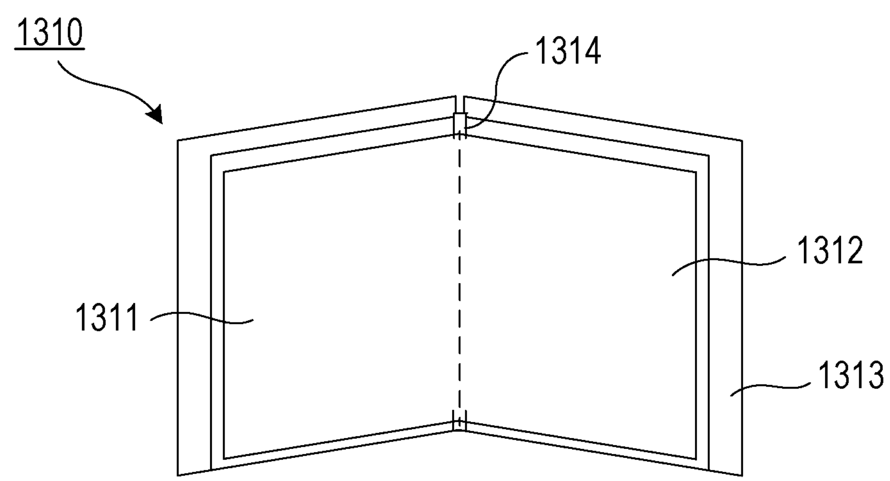
FIG. 6B is a schematic view illustrating an example of a foldable display apparatus.

FIGS. 6A and 6B are schematic views illustrating examples of a display apparatus according to an embodiment. FIG. 6A illustrates a display apparatus such as a television monitor or a PC monitor. A display apparatus 1300 includes a frame 1301 and a display unit 1302. The display unit 1302 may employ the light emitting device according to the embodiment.

The display apparatus includes a base 1303, which supports the frame 1301 and the display unit 1302. The base 1303 is not limited to the form illustrated in FIG. 6A. The lower side of the frame 1301 may also function as the base.

The frame 1301 and the display unit 1302 may be curved. The radius of the curvature may be 5000 mm or more and 6000 mm or less.

FIG. 6B is a schematic view illustrating another example of the display apparatus according to this embodiment. A display apparatus 1310 in FIG. 6B can be folded, namely a foldable display apparatus. The display apparatus 1310 includes a first display unit 1311, a second display unit 1312, a housing 1313, and a folding point 1314. The first display unit 1311 and the second display unit 1312 may include the light emitting device according to the embodiment. The first display unit 1311 and the second display unit 1312 may be collectively designed as a seamless single display apparatus. The first display unit 1311 and the second display unit 1312 can be sectioned with respect to the folding point. Specifically, the first display unit 1311 and the second display unit 1312 may individually display different images; and the first and second display units may collectively display a single image.

Figure 7A:
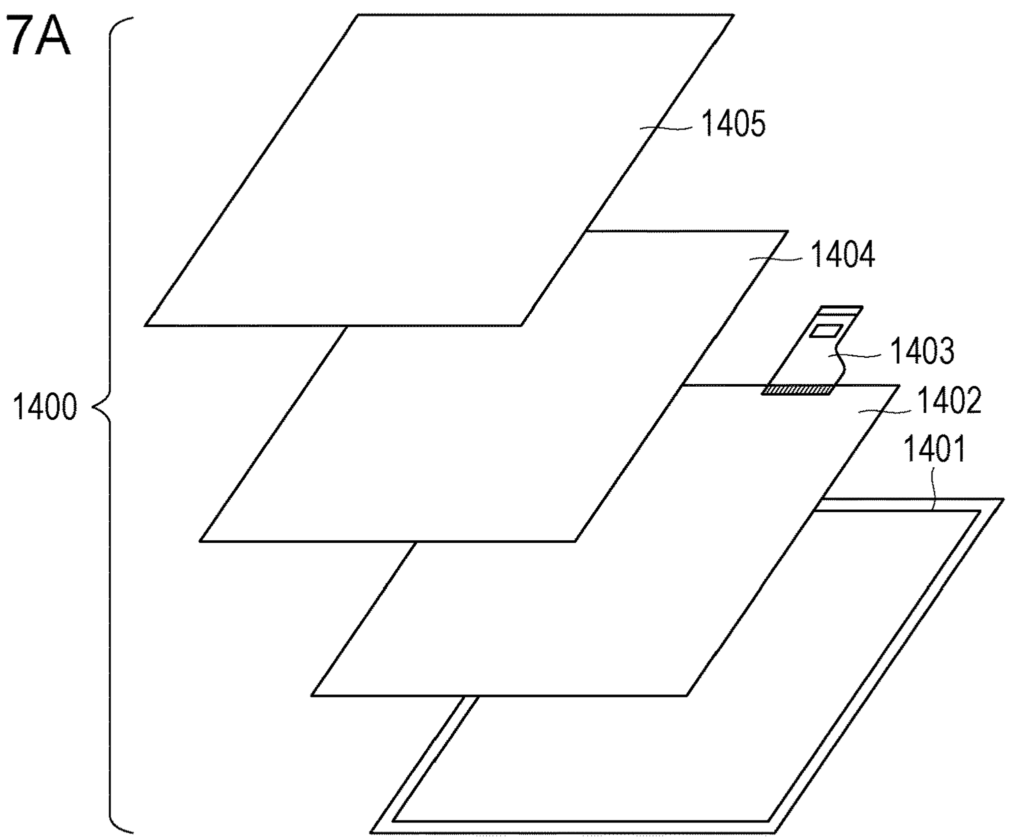
FIG. 7A is a schematic view illustrating an example of an illumination apparatus according to an embodiment of the present disclosure.

FIG. 7A is a schematic view illustrating an example of an illumination apparatus according to an embodiment. An illumination apparatus 1400 may include a housing 1401, a light source 1402, a circuit substrate 1403, an optical film 1404, and a light diffusion unit 1405. The light source may include the organic light emitting device according to the embodiment. An optical filter may be provided to improve color rendering of the light source. The light diffusion unit is configured to effectively diffuse light from the light source to deliver the light to a wide area, such as lighting up. The optical filter and the light diffusion unit may be provided on the light exit side of the illumination. The illumination may be optionally equipped with a cover for the outermost portion thereof.

The illumination apparatus is, for example, an apparatus configured to illuminate the inside of a room. The illumination apparatus may be configured to emit light of any color of white, neutral white, and colors from blue to red. The illumination apparatus may include a light modulation circuit for modulating the light. The illumination apparatus may include an organic light emitting device according to the present disclosure and a power supply circuit connected to the organic light emitting device. The power supply circuit is configured to convert alternating current voltage to direct current voltage. The "white" corresponds to a color temperature of 4200 K. The "neutral white" corresponds to a color temperature of 5000 K. The illumination apparatus may include a color filter.

The illumination apparatus according to this embodiment may include a heat dissipation unit. The heat dissipation unit is configured to release heat inside of the apparatus to the outside of the apparatus. The heat dissipation unit is formed of, for example, a metal having a high specific heat or liquid silicone.

Figure 7B:
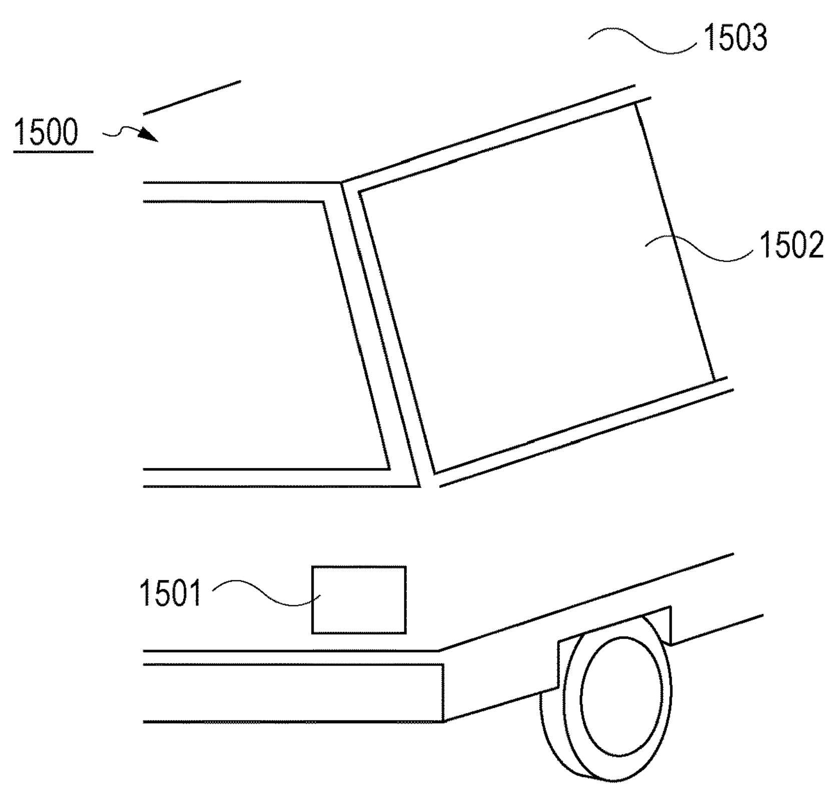
FIG. 7B is a schematic view illustrating an example of an automobile including a vehicle illumination unit according to an embodiment of the present disclosure.

FIG. 7B is a schematic view of an automobile serving as an example of a moving object according to an embodiment. The automobile includes a tail lamp serving as an example of the illumination unit. An automobile 1500 includes a tail lamp 1501 that may be configured to turn on upon braking, for example.

The tail lamp 1501 may include the organic light emitting device according to the embodiment. The tail lamp may include a protective member for protecting the organic light emitting device. The protective member is not limited in terms of material as long as it has relatively high strength and is transparent. The protective member can be formed of polycarbonate, for example. The polycarbonate may be mixed with, for example, a furandicarboxylic acid derivative or an acrylonitrile derivative.

The automobile 1500 may include an automobile body 1503 and a window 1502 attached to the automobile body 1503. When the window is not windows for checking ahead or behind of the automobile, it may be designed as a transparent display. This transparent display may include the organic light emitting device according to the embodiment. In this case, constituent members of the organic light emitting device, such as electrodes, are provided as transparent members.

The moving object according to this embodiment may be a ship, an aircraft, or a drone, for example. The moving object may include a body and an illumination unit provided to the body. The illumination unit may emit light in order to indicate the position of the body. The illumination unit includes the organic light emitting device according to the embodiment.

As has been described so far, apparatuses employing the organic light emitting device according to the embodiment enable displaying of images with high quality for a long time with stability.

EXAMPLES

Example 1

In this Example, an organic light emitting device having a top emission structure was produced in which, on an insulating layer, an anode, a hole injection layer, a first hole transport layer, a second hole transport layer, a first light emitting layer, a second light emitting layer, a hole blocking layer, an electron transport layer, an electron injection layer, and a cathode were formed in this order.

On a glass substrate, a Ti film having a thickness of 40 nm was formed by sputtering, and patterned by photolithography to form an anode such that the counter electrode (metal electrode layer, cathode) would have an electrode area of 3 $mm^2$.

Subsequently, in a vacuum deposition apparatus (manufactured by ULVAC, Inc.), a cleaned substrate having the electrode and materials were attached; the apparatus was evacuated to $1.33\times10^{-4}$ Pa ($1\times10^{-6}$ Torr), and then UV/ozone cleaning was performed. Subsequently, layers were formed so as to have a layer configuration described in the following Table 1.

TABLE 1

| | Materials | | | Film thickness (nm) |
|---|---|---|---|---|
| Cathode | Mg:Ag = 1:1 | | | 10 |
| Electron injection layer | LiF | | | 1 |
| Electron transport layer | ET1 | | | 30 |
| Hole blocking layer | ET11 | | | 70 |
| Light emitting layer 2 | Host B | EMH1 | Weight ratio | 10 |
| | Dopant C | BD6 | EMH1:BD6 = 99.4:0.6 | |
| Light emitting layer 1 | Host A | EMH1 | Weight ratio | 10 |
| | Dopant A | GD7 | EMH1:GD7:RD6 = | |
| | Dopant B | RD6 | 96:3.6:0.4 | |
| Second hole transport layer | HT14:EMH1 = 50:50 | | | 10 |
| First hole transport layer | HT14:HT1 = 30:70 | | | 10 |
| Hole injection layer | HATCN | | | 7 |

Subsequently, the substrate was moved into a glove box, and sealed, within a nitrogen atmosphere, using a glass cap including a drying agent, to obtain an organic light emitting device. The organic light emitting device upon energization emitted white light.

The obtained organic light emitting device was connected to a voltage application device, and evaluated in terms of characteristics. The current-voltage characteristics were measured with a pA meter 4140B manufactured by Hewlett-Packard Company. The chromaticity was evaluated with an SR-3 manufactured by TOPCON CORPORATION. The emission luminance was measured with a BM7 manufactured by TOPCON CORPORATION. The results are described in Table 3 below together with results of other Examples and Comparative Examples.

Examples 2 to 8 and Comparative Examples 1 to 8

Devices were produced as in Example 1 except that the first hole transport layer, the second hole transport layer, and the light emitting layer were changed to compounds described in Table 3 below. The results are described in Table 3.

Examples 9 and 10

In Example 9, layers were formed so as to have a layer configuration described in the following Table 2. In Example 10, a device was produced as in Example 9 except that mixing ratios of the first hole transport layer and the second hole transport layer were changed. The results are described in Table 3.

TABLE 2

| | | | Materials | Film thickness (nm) |
|---|---|---|---|---|
| Cathode | | | Mg:Ag = 1:1 | 10 |
| Electron injection layer | | | LiF | 1 |
| Electron transport layer | | | ET1 | 30 |
| Hole blocking layer | | | ET11 | 70 |
| Light emitting layer 2 | Host B | EMH1 | Weight ratio | 10 |
| | Dopant C | BD2 | EMH1:BD2 = | |
| | | | 99.4:0.6 | |
| Light emitting layer 1 | Host A | EMH1 | Weight ratio | |
| | Dopant A | GD4 | EMH1:GD4:RD4 = | 10 |
| | Dopant B | RD4 | 96:3.6:0.4 | |
| Electron blocking layer | | | HT14:EMH1 = 50:50 | 10 |
| Hole transport layer | | | HT14:HT1 = 30:70 | 10 |
| Hole injection layer | | | HATCN | 7 |

TABLE 3

| Example Comparative Example | First hole transport layer | Second hole transport layer | Light emitting layer | V@80 mA/cm$^2$ | External quantum efficiency EQE |
|---|---|---|---|---|---|
| Example 1 | HT4:HT14 70:30 | HT14:EMH1 50:50 | Example 1 | 7.1 | 3.0 |
| Example 2 | HT2:HT14 70:30 | HT14:EMH1 75:25 | Same as above | 7.0 | 3.1 |
| Comparative Example 1 | HT2 | HT14 | Same as above | 7.4 | 3.0 |
| Comparative Example 2 | HT2 | HT14:EMH1 50:50 | Same as above | 7.3 | 3.0 |
| Comparative Example 3 | HT14 | HT14:EMH1 50:50 | Same as above | 7.8 | 2.8 |
| Example 3 | HT2:HT13 70:30 | HT13:EMH1 50:50 | Same as above | 6.9 | 3.1 |
| Example 4 | HT2:HT13 70:30 | HT13:EMH1 75:25 | Same as above | 6.8 | 3.1 |
| Comparative Example 4 | HT2:HT13 70:30 | HT13 | Same as above | 7.2 | 3.0 |
| Example 5 | HT3:HT15 60:40 | HT15:EMH1 50:50 | Same as above | 6.9 | 3.0 |
| Example 6 | HT3:HT15 60:40 | HT15:EMH1 70:30 | Same as above | 6.8 | 3.1 |
| Comparative Example 5 | HT3 | HT15:EMH1 50:50 | Same as above | 7.2 | 3.1 |
| Comparative Example 6 | HT15 | HT15:EMH1 50:50 | Same as above | 7.7 | 2.8 |
| Comparative Example 7 | HT3 | HT15 | Same as above | 7.3 | 3.1 |
| Example 7 | HT4:HT13 65:35 | HT13:EMH1 50:50 | Same as above | 6.9 | 3.0 |
| Example 8 | HT4:HT13 65:35 | HT13:EMH1 70:30 | Same as above | 6.8 | 3.1 |
| Comparative Example 8 | HT4:HT13 65:35 | HT13 | Same as above | 7.3 | 3.0 |
| Example 9 | HT2:HT14 70:30 | HT14:EMH1 50:50 | Example 9 | 7.0 | 2.5 |
| Example 10 | HT2:HT14 70:30 | HT14:EMH1 75:25 | Same as above | 6.9 | 2.6 |

Examples 11 and 12 and Comparative Examples 9 to 11

In Example 11, layers were formed so as to have a layer configuration described in the following Table 4. In Example 12 and Comparative Examples 9 to 11, devices were produced as in Example 11 except that the first hole transport layer and the second hole transport layer were changed as described in Table 5. The results are described in Table 5.

TABLE 4

| | Materials | | | Film thickness (nm) |
|---|---|---|---|---|
| Cathode | Mg:Ag = 1:1 | | | 10 |
| Electron injection layer | LiF | | | 1 |
| Electron transport layer | ET1 | | | 30 |
| Hole blocking layer | ET18 | | | 70 |
| Light emitting layer | Host B | EMH1 | Weight ratio | 20 |
| | Dopant C | BD6 | EMH1:BD6 = 99.4:0.6 | |
| Second hole transport layer | HT14:EMH1 = 50:50 | | | 10 |
| First hole transport layer | HT14:HT1 = 30:70 | | | 10 |
| Hole injection layer | HATCN | | | 7 |

TABLE 5

| Example Comparative Example | First hole transport layer | Second hole transport layer | Light emitting layer | V@80 mA/cm$^2$ | External quantum efficiency EQE |
|---|---|---|---|---|---|
| Example 11 | HT2:HT14 70:30 | HT14:EMH1 50:50 | Example 1 | 7.2 | 4.0 |
| Example 12 | HT2:HT14 70:30 | HT14:EMH1 75:25 | Same as above | 7.1 | 4.2 |
| Comparative Example 9 | HT2 | HT14 | Same as above | 7.6 | 4.1 |
| Comparative Example 10 | HT2 | HT14:EMH1 50:50 | Same as above | 7.5 | 4.1 |
| Comparative Example 11 | HT2:HT14 70:30 | HT14 | Same as above | 7.4 | 4.0 |

Example 13

Evaluations of HOMO Energy and LUMO Energy

The hosts and dopants were evaluated in the following manner.

A) Method for Evaluating HOMO Energy

On aluminum substrates, thin films having a thickness of 30 nm were formed. These thin films were measured with an AC-3 (manufactured by Riken Keiki Co., Ltd.).

B) Method for Evaluating LUMO Energy

On quartz substrates, thin films having a thickness of 30 nm were formed. These thin films were each measured using a spectrophotometer (V-560, manufactured by JASCO Corporation) in terms of the optical band gap (absorption edge) of the measurement material. The optical band gap value was applied as the difference from the above-described HOMO energy value, to obtain a LUMO energy value. The results are described in Table 6.

TABLE 6

| Material No. | HOMO energy (eV) | LUMO energy (eV) |
|---|---|---|
| HT1 | 5.4 | 2.6 |
| HT2 | 5.5 | 2.6 |
| HT3 | 5.5 | 2.5 |
| HT13 | 5.6 | 2.6 |
| HT14 | 5.6 | 2.7 |
| HT15 | 5.7 | 2.7 |
| EMH1 | 6.0 | 3.0 |
| EMH8 | 5.8 | 2.9 |
| BD6 | 6.1 | 3.4 |
| BD7 | 5.5 | 2.8 |

TABLE 6-continued

| Material No. | HOMO energy (eV) | LUMO energy (eV) |
|---|---|---|
| GD7 | 5.9 | 3.5 |
| GD4 | 5.6 | 3.2 |
| RD6 | 5.6 | 3.7 |
| RD4 | 5.4 | 3.5 |

As is clear from Examples, organic light emitting devices according to embodiments of the present disclosure in which the first hole transport layer and the second hole transport layer are mixture layers have been found to emit light at high efficiencies and at low voltages. By contrast, as is clear from Comparative Examples, devices in which at least one of the hole transport layers is not a mixture layer have been found to emit light at increased voltages.

In addition, devices satisfying the following relation:

Absolute value of HOMO energy: (Host material)>(Hole transport material B)>(Hole transport material A), have been found to have further reduced drive voltages.

In Examples 1 to 8 and Examples 11 and 12, on the basis of the HOMO-LUMO relations in the light emitting layers, the light emission dopants have an electron-trap capability; in Examples 9 and 10, light emission dopants do not have an electron-trap capability. Comparisons among these Examples have revealed that light emission dopants having an electron-trap capability provide improved efficiency.

The present disclosure can provide an organic light emitting device having a reduced drive voltage.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-087710, filed May 7, 2019, which is hereby incorporated by reference herein in its entirety.

What is claimed is:

1. An organic light emitting device comprising, in sequence, a first electrode, a charge injection layer, a first charge transport layer, a second charge transport layer in contact with the first charge transport layer, a light emitting layer in contact with the second charge transport layer, and a second electrode, wherein the first charge transport layer includes a first material and a second material different from the first material, wherein the second charge transport layer includes the second material and a third material different from the first material and the second material, wherein the charge injection layer includes a fifth material, wherein the second charge transport layer does not include the first material, wherein a weight ratio of the first material is larger than a weight ratio of the second material in the first charge transport layer, and wherein the fifth material has an absolute value of lowest unoccupied molecular orbital (LUMO) energy equal to or larger than an absolute value of highest occupied molecular orbital (HOMO) energy of the first material or an absolute value of HOMO energy of the second material.

2. The organic light emitting device according to claim 1, wherein the light emitting layer includes the third material and a forth material.

3. The organic light emitting device according to claim 1, wherein a weight of the second material is larger than a weight of the third material in the second charge transport layer.

4. The organic light emitting device according to claim 2, wherein a weight of the third material is larger than a weight of the fourth material in the light emitting layer.

5. The organic light emitting device according to claim 2, wherein the fourth material has an absolute value of lowest LUMO energy larger than an absolute value of LUMO energy of the third material.

6. The organic light emitting device according to claim 1, wherein the second material has an absolute value of LUMO energy smaller than an absolute value of LUMO energy of the third material.

7. The organic light emitting device according to claim 1, wherein the first material has an absolute value of LUMO energy smaller than an absolute value of LUMO energy of the second material.

8. The organic light emitting device according to claim 1, wherein the third material has an absolute value of occupied HOMO energy equal to or larger than an absolute value of HOMO energy of the second material.

9. The organic light emitting device according to claim 1, wherein the second material has an absolute value of HOMO energy equal to or larger than an absolute value of HOMO energy of the first material.

10. The organic light emitting device according to claim 1, wherein the first material and the second material have a hole transport capability.

11. The organic light emitting device according to claim 2, wherein the fourth material is a light emitting material.

12. The organic light emitting device according to claim 2, wherein the fourth material is a condensed polycyclic compound including a five- membered ring.

13. The organic light emitting device according to claim 1, wherein the third material is constituted by a material composed of a hydrocarbon alone.

14. The organic light emitting device according to claim 1, wherein the third material includes an aryl group, the aryl group optionally having, as a substituent, an alkyl group having 1 to 12 carbon atoms, and the aryl group is selected from the group consisting of benzene, naphthalene, fluorene, benzofluorene, phenanthrene, chrysene, triphenylene, pyrene, fluoranthene, and benzofluoranthene.

15. The organic light emitting device according to claim 1, wherein the first electrode is an electrode configured to reflect light, and the second electrode is an electrode configured to transmit light.

16. The organic light emitting device according to claim 1, wherein the light emitting layer includes at least two layers.

17. A display apparatus comprising a plurality of pixels, wherein at least one of the plurality of pixels includes the organic light emitting device according to claim 1, and a transistor connected to the organic light emitting device.

18. A photoelectric conversion apparatus comprising:

an optical unit including a plurality of lenses;

an image pickup device configured to receive light having passed through the optical unit; and a display unit configured to display an image captured with the image pickup device, wherein the display unit includes the organic light emitting device according to claim 1.

19. An electronic apparatus comprising:

a display unit including the organic light emitting device according to claim 1;

a housing provided with the display unit; and a communication unit provided in the housing, and configured to communicate with an external device.

20. An illumination apparatus comprising:

a light source including the organic light emitting device according to claim 1; and a light diffusion unit or an optical film configured to transmit light emitted from the light source.

21. A moving object comprising:

an illumination unit including the organic light emitting device according to claim 1; and a body provided with the illumination unit.

22. An organic light emitting device comprising, in sequence, a first electrode, a charge injection layer, a first charge transport layer, a second charge transport layer in contact with the first charge transport layer, a light emitting layer in contact with the second charge transport layer, and a second electrode, wherein the first charge transport layer includes a first material and a second material, the second charge transport layer includes the second material and a third material, the light emitting layer includes the third material and a fourth material, the charge injection layer includes a fifth material, the second material has an absolute value of highest occupied molecular orbital (HOMO) energy equal to or larger than an absolute value of HOMO energy of the first material, and the fifth material has an absolute value of lowest unoccupied molecular orbital (LUMO) energy equal to or larger than an absolute value of HOMO energy of the first material or an absolute value of HOMO energy of the second material.

23. The organic light emitting device according to claim 22, wherein a weight ratio of the first material is larger than a weight ratio of the second material in the first charge transport layer.

24. The organic light emitting device according to claim 22, wherein a weight of the second material is larger than a weight of the third material in the second charge transport layer.

25. The organic light emitting device according to claim 22, wherein a weight of the third material is larger than a weight of the fourth material in the light emitting layer.

26. The organic light emitting device according to claim 22, wherein the second material has an absolute value of LUMO energy smaller than an absolute value of LUMO energy of the third material, and wherein the first material has an absolute value of LUMO energy smaller than an absolute value of LUMO energy of the second material.

27. The organic light emitting device according to claim 22, wherein the third material has an absolute value of HOMO energy equal to or larger than an absolute value of HOMO energy of the second material, and wherein the second material has an absolute value of HOMO energy equal to or larger than an absolute value of HOMO energy of the first material.

* * * * *